(12) United States Patent
Irino

(10) Patent No.: US 7,271,097 B2
(45) Date of Patent: Sep. 18, 2007

(54) METHOD FOR MANUFACTURING A SEMICONDUCTOR PROTECTION ELEMENT AND A SEMICONDUCTOR DEVICE

(75) Inventor: Hitoshi Irino, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/347,265

(22) Filed: Feb. 6, 2006

(65) Prior Publication Data

US 2006/0125104 A1 Jun. 15, 2006

Related U.S. Application Data

(62) Division of application No. 10/796,999, filed on Mar. 11, 2004, now Pat. No. 7,087,999.

(30) Foreign Application Priority Data

Mar. 12, 2003 (JP) ............................ 2003-066161

(51) Int. Cl.
*H01L 21/44* (2006.01)
*H01L 23/52* (2006.01)
(52) U.S. Cl. ...................... 438/682; 257/767
(58) Field of Classification Search ........ 257/754–757, 257/767–770; 438/648–650, 655, 656
See application file for complete search history.

(56) References Cited

U.S. PATENT DOCUMENTS

| 5,208,472 | A | 5/1993 | Su et al. |
| 5,637,902 | A | 6/1997 | Jiang |
| 5,702,972 | A | 12/1997 | Tsai et al. |
| 5,744,395 | A | 4/1998 | Shue et al. |
| 5,838,033 | A | 11/1998 | Smooha |
| 6,265,252 | B1 | 7/2001 | Lin |
| 6,479,870 | B1 | 11/2002 | Chen et al. |
| 6,528,380 | B2 | 3/2003 | Woolery et al. |
| 6,531,745 | B1 | 3/2003 | Woolery et al. |
| 6,534,402 | B1 | 3/2003 | Liao |
| 2002/0030230 | A1 | 3/2002 | Okawa et al. |

FOREIGN PATENT DOCUMENTS

| JP | 02-271673 | 11/1990 |
| JP | 04-241452 | 8/1992 |
| JP | 07-183516 | 7/1995 |
| JP | 07-202009 | 8/1995 |
| JP | 10-098186 | 4/1998 |
| JP | 2773220 | 4/1998 |
| JP | 2000-156469 A | 6/2000 |

*Primary Examiner*—Calvin Lee
(74) *Attorney, Agent, or Firm*—Foley & Lardner LLP

(57) ABSTRACT

A semiconductor protection element is provided in which no heat generation occurs in a concentrated manner, in a region having a high resistance value even when electrostatic discharge (ESD) is applied, without an increase in an area of the semiconductor device. The semiconductor protection element is made up of an N-type well, P-type semiconductor substrate having a pair of N+ diffusion layers each having an impurity concentration being higher than that of the N-type well, and a silicide layer partially formed on each of the two N+ diffusion layers. The N-type well has a first exposed region being exposed on the semiconductor substrate and the silicide layer is so formed that a part of each of the two N+ diffusion layers has a second exposed region being exposed successively so as to be in contact with the first exposed region. The first exposed region is sandwiched by two N+ diffusion layers.

24 Claims, 16 Drawing Sheets

METHOD FOR MANUFACTURING A SEMICONDUCTOR PROTECTION ELEMENT AND A SEMICONDUCTOR DEVICE

CROSS-REFERENCE TO RELATED PATENT APPLICATIONS

This application is a division of application Ser. No. 10/796,999, filed Mar. 11, 2004 and issued as U.S. Pat. No. 7,087,999, which is based on Japanese Patent Application No. 2003-066161, filed Mar. 12, 2003 by Hitoshi Irino. This application claims only subject matter disclosed in the parent application and therefore presents no new matter.

BACKGROUND OF THE INVENTION

1. Field of the Invention

The present invention relates to a semiconductor protection element, a semiconductor device and a method for manufacturing the same, and more particularly to the semiconductor protection element and the semiconductor device in which an electrostatic protection circuit to protect the semiconductor protection element or the semiconductor device from electrostatic discharge (ESD) is formed therein and the method for manufacturing the same.

The present application claims priority of Japanese Patent Application No. 2003-066161 filed on Mar. 12, 2003, which is hereby incorporated by reference.

2. Description of the Related Art

In recent years, in order to serve the need for scaling down a semiconductor protection element, it is necessary that an impurity diffusion layer making up a source region and a drain region have to be formed so that the impurity diffusion layer has a shallow depth.

However, formation of the impurity diffusion layer having a shallow depth causes resistance values in the source region and drain region to become high and the current driving capability of a transistor to be deteriorated remarkably.

To solve such the problem, a transistor is proposed which has a structure in which a silicide layer is selectively formed in a source region and a drain region to lower a resistance value on the source region and drain region. Such the structure is generally called as a salicide structure.

However, the salicide has a problem in that, though it is possible to lower a resistance value in the source region and in the drain region, it is vulnerable to electrostatic discharge (ESD).

In general, in order for an integrated circuit to be able to be resistant to electrostatic discharge (ESD), the following two conditions have to be satisfied.

(1) A protecting element mounted on an integrated circuit efficiently removes electrostatic discharge (ESD) so that an overvoltage and an overcurrent caused by the electrostatic discharge (ESD) both are not applied to object elements to be protected.

(2) A protecting element itself mounted on an integrated circuit is resistant to electrostatic discharge (ESD).

In the integrated circuit having the salicide structure, the above condition (2) becomes a big problem. The resistance of the protecting element to electrostatic discharge (ESD) is determined depending on distribution of resistance values from a drain to a source. If there exists a local region in which a resistance value is large compared with other region, heat is locally generated in the region, which causes high probability of occurrence of an electrostatic breakdown.

In a transistor having the salicide structure, as described above, since a resistance value is extremely lowered by introducing silicide in the source region and the drain region, heat is locally generated in a region from an LDD (Lightly-doped Drain)-structured region to a channel region formed at both ends of a gate of the transistor and, as a result, the resistance to electrostatic discharge (ESD) is remarkably lowered compared with a transistor having no salicide structure.

To solve these problems, various types of semiconductor devices are proposed.

FIG. 26 shows a first conventional example of a semiconductor device 200 disclosed in Japanese Patent No. 2773220 which corresponds to Japanese Patent Application Laid-open No. 02-271673.

The semiconductor device 200 includes a P-type substrate 201 on which an N+ diffusion layer 202 and an LDD-structured layer 203 of impurity concentration being lower than that in the N+ diffusion layer 202 in a manner that the two layers overlap each other are formed.

On the N+ diffusion layer 202 are formed, in a selective manner, a first silicide layer 204a, a second silicide layer 204b, and a third silicide layer 204c. On the first silicide layer 204a is formed a source electrode 205 and on the third silicide layer 204c is formed a drain electrode 206.

On the P-type substrate 201 between the first silicide layer 204a and the second silicide layer 204b is formed a gate insulating film 207, in a lower position of which, however, the LDD-structured layer 203 is not formed, and on the gate insulating film 207 is formed a gate electrode 208. A side wall 209 is formed in a manner that it surrounds the gate electrode 208. FIG. 27 is a cross-sectional view of a semiconductor device 210, shown as a second conventional example, disclosed in U.S. Pat. No. 6,479,870.

The semiconductor device 210 shown in FIG. 27 differs from that shown in FIG. 26 in that an N-type well 211 is formed on a surface of a P-type substrate 201 between a second silicide layer 204b and a third silicide layer 204c and in that a field oxide film 212, instead of an LDD-structured layer 203 and an N+ diffusion layer 202, is formed between the second silicide layer 204 and the third silicide layer 204c.

FIG. 28 is a cross-sectional view of a semiconductor device 220, shown as a third conventional example, disclosed in U.S. Pat. No. 5,637,902.

The semiconductor device 220 shown in FIG. 27 differs from that shown in FIG. 26 in that an N-type well 221 is formed on a surface of a P-type substrate 201 between a second silicide layer 204b and a third silicide layer 204c and in that a gate electrode structure 222 made up of a gate oxide film, gate electrode, and a side wall, instead of an LDD-structured layer 203 and N+ diffusion layer 202, is formed the second silicide layer 204b and the third silicide layer 204c.

The semiconductor devices 200, 210, and 220 shown, respectively, in FIGS. 26, 27, and 28 have regions 230a, 230b, and 230c in each of which a silicide layer is not formed, respectively, between the second silicide layer 204b and third silicide layer 204c. Thus, by having the regions 230a, 230b, and 230c with no silicide layer being formed, it is made possible to make uniform resistance existing between a wiring material (not shown) to an end of each of the source electrode and the drain electrode, which enables resistance to electrostatic discharge (ESD) to be increased.

In the semiconductor device 200 shown in FIG. 26, on the N+ diffusion layer 202 which serves as a region where an impurity of high concentration is implanted, is formed the region 230d in which the silicide layers 204b and 204c are not formed and the silicide layer 204b and 204c serve as a region having a low resistance value and the region 230a serves as a region having an intermediate resistance value.

In the semiconductor device 210 shown in FIG. 26 and in the semiconductor device 220 shown in FIG. 28, the regions such as the N-type wells 211 and 221, or the LDD-structured layer 203 in which the impurity of low concentration is implanted function as regions having a high resistance value.

However, in the semiconductor device 200 shown in FIG. 26, since the N+ diffusion layer 202 into which the impurity of high concentration has been implanted exists directly below the region 230a in which no silicide layer has been formed, a resistance value per a unit area in the semiconductor device 200 is small. Therefore, if a resistor element is made up of only regions having small resistance values as in the case of the semiconductor device 200, in order to acquire a desired resistance value, the resistor element, that is, an area of the region 230a has to be made large in a manner to correspond to the desired resistance value, which makes it impossible to manufacture a semiconductor device having a small area and, as a result, makes it difficult to meet the recent years' need for scaling down semiconductor devices.

In this respect, if the resistor element is made up of regions having high resistance as in the case of the semiconductor device 210 shown in FIG. 27 and the semiconductor device 220 shown in FIG. 28, unlike in the case of the semiconductor device 220 shown in FIG. 28, it is made possible to reduce the area of the semiconductor device. However, if a big current caused by application of electrostatic discharge (ESD) happens to flow, there is a problem in that the resistor element itself is easily broken down.

This problem is described by referring to FIG. 29 below. FIG. 29A is a cross-sectional view showing the field oxide film 212 and regions surrounding the field oxide film 212 making up the semiconductor device 210 shown in FIG. 27. FIG. 29B is a graph showing a relation between a position corresponding to the region shown in FIG. 29A and a voltage to be applied.

As is apparent from FIG. 29B, if a big current flows due to application of electrostatic discharge (ESD), a rapid voltage drop from V1 to V2 occurs in the region 230b having a high resistance value. As a result, heat is locally generated in the region 230b having a high resistance value in a concentrated manner. Especially, in order to reduce an area of a semiconductor device, the region 230b having high resistance values is formed so as to have a small area and, therefore, an amount of heat generated per unit area becomes very large. Therefore, a probability that the resistor element itself is thermally broken down becomes very large.

SUMMARY OF THE INVENTION

In view of the above, it is an object of the present invention to provide a semiconductor protection element and a semiconductor device in which no heat generation occurs in a concentrated manner, in a region having a high resistance value even when electrostatic discharge (ESD) is applied, without an increase in an area of the semiconductor device and a method for manufacturing the semiconductor protection element and the semiconductor device.

According to a first aspect of the present invention, there is provided a semiconductor protection element including:
a semiconductor substrate having a first region of a first impurity concentration and a pair of second regions having a second impurity concentration being higher than that of the first region; and
silicide layers each being formed in a manner so as to be in contact with a surface of each of the second regions;
wherein the first region has a first surface region not covered with the silicide layers and the second regions have second surface regions not covered with the silicide layers and the first surface region is sandwiched by two the second surface regions;
wherein each of the silicide layers is formed in a manner that each of the second surface regions is in contact with the first surface region in a continued manner and that each of the second surface regions is exposed; and
wherein each of the silicide layers makes up a low resistance region having a relatively low resistance value, each of the second surface regions makes up an intermediate resistance region having an intermediate resistance value, and the first surface region makes up a high resistance region having a relatively high resistance value.

For example, both the region having a high resistance value and the region having an intermediate resistance value are exposed on a surface of the semiconductor substrate. Therefore, a resistance value of a semiconductor protection element changes in stages depending on a position and no concentration of heat generation in the region having a high resistance value occurs. As a result, resistance to electrostatic breakdown can be increased when compared with the case of the conventional semiconductor protection element in which a resistor element is formed by using the region having a high resistance value. Moreover, the resistor element is made up of three kinds of resistance regions including the region having a high resistance value, regions having an intermediate resistance value and regions having a low resistance value and, therefore, a desired resistance can be obtained even in a smaller area and an entire area of a semiconductor protection element can be reduced when compared with the case of the semiconductor protection element in which the resistor element is made up of the region having a low resistance value or an intermediate resistance value. Thus, since three kinds of resistance regions exist in a mixed manner, the resistor element or electrostatic protection circuit, though having a small area, can have a high resistance to electrostatic breakdown.

According to a second aspect of the present invention, there is provided a semiconductor protection element including:
a semiconductor substrate having a first region of a first impurity concentration and a pair of second regions having a second impurity concentration being higher than that of the first region; and
silicide layers each being partially formed in a manner so as to be in contact with a surface of the second regions;
wherein the first region has a first exposed region being exposed on a surface of the semiconductor substrate and each of the silicide layers is so formed as to have a second exposed region in which part of each of the second regions is exposed on a surface of the semiconductor substrate in a manner so as to continuously be in contact with the first exposed region;
wherein the first exposed region is sandwiched by two the second regions; and
wherein each of the silicide layers makes up a low resistance region having a relatively low resistance value, each of the second exposed regions in the second region makes up an intermediate resistance region having an intermediate resistance value, and the first exposed region in the first region makes up a high resistance region having a relatively high resistance value.

According to a third aspect of the present invention, there is provided a semiconductor protection element including:

a semiconductor substrate having a first region of a first impurity concentration and a pair of second regions having a second impurity concentration being higher than that of the first region;

wherein the first region is made up of a well region;

wherein, on the first region, a third region of a third impurity concentration being higher than the first impurity concentration and being lower than the second impurity concentration is formed;

wherein the third region is sandwiched by two the second regions, makes up a first exposed region being exposed on a surface of the semiconductor substrate and, on a surface of the semiconductor substrate, the third region and the second region are overlapped each other;

wherein each of the silicide layers is so formed as to have a second exposed region in which part of each of the second regions is exposed on a surface of the semiconductor substrate in a manner so as to continuously be in contact with the first exposed region; and wherein each of the silicide layers makes up a low resistance region having a relatively low resistance value, each of the second exposed regions in the second region makes up an intermediate resistance region having an intermediate resistance value, and the first exposed region in the third region makes up a high resistance region having a relatively high resistance value.

In the foregoing first, second and/or third aspects, a preferable mode is one wherein a field oxide film is formed on the first surface region or on the first exposed region.

A preferable mode is one wherein the first region is made up of a well region.

Also, a preferable mode is one wherein the first region is formed on a surface of the semiconductor substrate and in a manner that the first region and the second region are overlapped on a surface of the semiconductor substrate.

Also, a preferable mode is one wherein, the first impurity concentration of the first region, when it is assumed that a well region is formed on the semiconductor substrate, is higher than that of the well region.

A preferable mode is one wherein a gate electrode structure is formed on the first surface region or on the first exposed region. A preferable mode is one wherein the second exposed region has a surface length being equal to or larger than that of the first exposed region.

A preferable mode is one wherein a surface length of the second exposed region is equal to or larger than a depth of the second region.

According to a fourth aspect of the present invention, there is provided a method for manufacturing a semiconductor protection element including:

a first step of implanting an impurity into a semiconductor substrate to form a first region of a first impurity concentration;

a second step of forming a pair of second regions having a second impurity concentration being higher than the first impurity concentration on both sides of the first region on a surface of the semiconductor substrate; and a third step of forming silicide layers being in contact with a surface of the second region;

wherein, in the third step, each of the silicide layers is formed in a manner that the first region has a first surface region not covered by the silicide layers and the second region has a second surface region not covered by the silicide layers and that the first surface region is sandwiched by two the second surface regions; and wherein each of the silicide layers makes up a low resistance region having a relatively low resistance value, each of the second surface regions makes up an intermediate resistance region having an intermediate resistance value, and the first surface region makes up a high resistance region having a relatively high resistance value.

According to a fifth aspect of the present invention, there is provided a method for manufacturing a semiconductor protection element including:

a first step of implanting an impurity into a semiconductor substrate to form a first region of a first impurity concentration;

a second step of forming a pair of second regions having a second impurity concentration being higher than the first impurity concentration on both sides of a first exposed region being exposed in the first region and on a surface of the semiconductor substrate; and a step of forming each of the silicide layers being in contact with a surface of the second region so that part of each of the second regions is exposed on the surface of the semiconductor substrate succesively so as to be in contact with the first exposed region of the first region;

wherein each of the silicide layers makes up a low resistance region having a relatively low resistance value, each of the second exposed regions in the second region makes up an intermediate resistance region having an intermediate resistance value, and the first exposed region in the first region makes up a high resistance region having a relatively high resistance value.

According to a sixth aspect of the present invention, there is provided a method for manufacturing a semiconductor protection element including:

a step of implanting an impurity into a semiconductor substrate to form a first region of a first impurity concentration;

a step of forming a third region having a third impurity concentration being higher than the first impurity concentration in a manner that the third region and the first region are overlapped on a surface of the semiconductor substrate;

a step of forming a pair of second regions having a second impurity concentration being higher than that of the third region on both sides of a first exposed region being exposed in the third region and on a surface of the semiconductor substrate;

a step of forming each of the silicide layers being in contact with a surface of the second region so that part of each of the second regions is exposed on a surface of the semiconductor substrate successively so as to be in contact with the first exposed region of the first region;

wherein each of the silicide layers makes up a low resistance region having a relatively low resistance value, each of the second exposed regions in the second region makes up an intermediate resistance region having an intermediate resistance value, and the first exposed region in the third region makes up a high resistance region having a relatively high resistance value.

In the foregoing fourth, fifth and/or sixth aspects, a preferable mode is one wherein each of the second regions and the first region are overlapped each other on a surface of the semiconductor substrate.

Also, a preferable mode is one wherein, the first impurity concentration of the first region, when it is assumed that a well region is formed on the semiconductor substrate, is higher than that of the well region.

Also, a preferable mode is one wherein the second exposed region has a surface length being equal to or larger than that of the first exposed region.

Also, a preferable mode is one wherein a surface length of the second exposed region is equal to or larger than a depth of the second region.

According to a seventh aspect of the present invention, there is provided a semiconductor device including:
  a semiconductor substrate having a first region of a first impurity concentration and a first "second region," second "second region" and third "second region" each having a second impurity concentration being higher than that of the first region;
  silicide layers each being formed in a manner so as to be in contact with a surface of each of the first "second region," second "second region" and third "second region;"
  one of a source electrode and a drain electrode being formed on one of the silicide layers formed in a manner so as to be in contact with the surface of the first "second region;"
  a gate electrode constructed between the silicide layers formed in a manner so as to be in contact with the surfaces of the first "second region" and second "second region;" and
  another of the source electrode and the drain electrode being formed on another out of the silicide layers formed in a manner so as to be in contact with the surface of the third "second region;"
  wherein the first region, the second "second region," and the third "second region" have, respectively, a first surface region, second "second surface region," and third "second surface region" all being positioned between the silicide layers formed in a manner so as to be in contact with the surfaces of the second "second region" and third "second region" and all being not covered with the silicide layers;
  wherein the first surface region is formed in a manner so as to be sandwiched between the second "second surface region" and third "second surface region;"
  wherein each of the silicide layers is constructed in a manner that the second "second surface region" and third "second surface region" are formed so as to be in contact with the surface of the first surface region and so as to expose the second "second surface region" and third "second surface region;"
  wherein each of the silicide layers makes up a low resistance region having a relatively low resistance value, each of the second surface regions makes up an intermediate resistance region having an intermediate resistance value, and the first surface region makes up a high resistance region having a relatively high resistance value.

According to an eighth aspect of the present invention, there is provided a semiconductor device including:
  a semiconductor substrate having a first region of a first impurity concentration and a first "second region," second "second region" and third "second region" each having a second impurity concentration being higher than that of the first region;
  silicide layers each being formed in a manner so as to be in contact with a surface of each of the first "second region," second "second region" and third "second region;"
  one of a source electrode and a drain electrode being formed on one of the silicide layers formed in a manner so as to be in contact with the surface of the first "second region;"
  a gate electrode constructed between the silicide layers formed in a manner so as to be in contact with the surfaces of the first "second region" and second "second region;" and
  another of the source electrode and the drain electrode being formed on another out of the silicide layers formed in a manner so as to be in contact with the surface of the third "second region;"
  wherein the first region has a first exposed region on a surface of the semiconductor substrate between the second "second region" and third "second region;"
  wherein each of the silicide layers is formed so as to have a second exposed region in a manner that the second "second region" and third "second region" are in contact with the second exposed region in a continuous manner;
  wherein the first exposed region is sandwiched between the second "second region" and third "second region;"
  wherein each of the silicide layers makes up a low resistance region having a relatively low resistance value, each of the second exposed regions in the second "second region" and third "second region" makes up an intermediate resistance region having an intermediate resistance value, and the first exposed region in the first region makes up a high resistance region having a relatively high resistance value.

According to a ninth aspect of the present invention, there is provided a semiconductor device including:
  a semiconductor substrate having a first region of a first impurity concentration, first "second region," second "second region" and third "second region" each having a second impurity concentration being higher than that of the first region, and a third region having an impurity concentration being higher than the first impurity concentration and being lower than the second impurity concentration;
  silicide layers each being formed in a manner so as to be in contact with a surface of each of the first "second region," second "second region" and third "second region;"
  one of a source electrode and a drain electrode being formed on one of the silicide layers formed in a manner so as to be in contact with the surface of the first "second region;"
  a gate electrode constructed between the silicide layers formed in a manner so as to be in contact with the surfaces of the first "second region" and second "second region;" and
  another of the source electrode and the drain electrode being formed on another out of the silicide layers formed in a manner so as to be in contact with the surface of the third "second region;"
  wherein the first region is made up of a well region;
  wherein the third region is formed on the first region;
  wherein the third region makes up a first exposed region being exposed on a surface of the semiconductor substrate between the second "second region" and the third "second regions" and, on a surface of the semiconductor substrate, the third region and the second region are overlapped each other;
  wherein each of the silicide layers is formed so as to have a second exposed region in a manner that the second "second region" and third "second region" are in contact with the first exposed region in a continuous manner;

wherein each of the silicide layers makes up a low resistance region having a relatively low resistance value, each of the second exposed regions in the second "second region" and third "second region" makes up an intermediate resistance region having an intermediate resistance value, and the first exposed region in the first region makes up a high resistance region having a relatively high resistance value.

In the foregoing seventh, eighth and/or ninth aspects, a preferable mode is one wherein a field oxide film is formed on the first surface region or the first exposed region. Also, a preferable mode is one wherein a gate electrode structure is formed on the first surface region or the first exposed region. Also, a preferable mode is one wherein the second exposed region has a surface length being equal to or larger than that of the first exposed region. Also, a preferable mode is one wherein a surface length of the second exposed region is equal to or larger than a depth of the second region.

According to a tenth aspect of the present invention, there is provided a method for manufacturing a semiconductor device including:
  a step of implanting an impurity into a semiconductor substrate to form a first region of a first impurity concentration;
  a step of forming first "second region," second "second region" and third "second region" each having an impurity concentration being higher than the first impurity concentration on the semiconductor substrate and of forming the second "second region" and third "second region" on both sides of the first region on a surface of the semiconductor substrate;
  a step of forming silicide layers formed in a manner to be in contact with a surface of each of the first "second region," second "second region" and third "second region" in a manner that the first region has a first surface region not covered with the silicide layers and the second "second region" and third "second region" have second surface regions not covered with the silicide layers and the first surface region is sandwiched by two the second surface regions;
  a step of forming a gate electrode constructed between the silicide layers formed in a manner so as to be in contact with the surfaces of the first "second region" and second "second region;"
  a step of forming one of a source electrode and a drain electrode being formed on the silicide layer formed in a manner so as to be in contact with the surface of the first "second region" and another of the source electrode and the drain electrode being formed on the silicide layer formed in a manner so as to be in contact with the surface of the third "second region;"
wherein each of the silicide layers makes up a low resistance region having a relatively low resistance value, each of the second surface regions makes up an intermediate resistance region having an intermediate resistance value, and the first surface region makes up a high resistance region having a relatively high resistance value.

According to an eleventh aspect of the present invention, there is provided a method for manufacturing a semiconductor device including:
  a step of implanting an impurity into a semiconductor substrate to form a first region of a first impurity concentration;
  a step of forming first "second region," second "second region" and third "second region" each having an impurity concentration being higher than the first impurity concentration on the semiconductor substrate and the second "second region" and third "second region" are formed on a surface of the semiconductor substrate on both sides of the first exposed region so that the first region has a first exposed region being exposed on a surface of the semiconductor substrate;
  a step of forming each of the silicide layers being in contact with a surface of each of the first "second region," second "second region" and third "second region" so that the second "second region" and third "second region" so as to have a second exposed region being successively in contact with the first exposed region of the first region;
  a step of forming a gate electrode constructed between the silicide layers formed in a manner so as to be in contact with surfaces of the first "second region" and second "second region;"
  a step of forming one of a source electrode and a drain electrode being formed on the silicide layer formed in a manner so as to be in contact with a surface of the first "second region" and another of the source electrode and the drain electrode being formed on the silicide layer formed in a manner so as to be in contact with the surface of the third "second region;"
wherein each of the silicide layers makes up a low resistance region having a relatively low resistance value, each of the second exposed regions in the second region makes up an intermediate resistance region having an intermediate resistance value, and the first exposed region in the first region makes up a high resistance region having a relatively high resistance value.

According to an twelfth aspect of the present invention, there is provided a method for manufacturing a semiconductor device including:
  a step of implanting an impurity into a semiconductor substrate to form a first region of a first impurity concentration;
  a step of forming a third region having a thirs impurity concentration being higher than the first impurity concentration in a manner that the third region and the first region are overlapped on a surface of the semiconductor substrate;
  a step of forming first "second region," second "second region" and third "second region" each having a second impurity concentration being higher than the third impurity concentration in the third region on the semiconductor substrate and the second "second region" and third "second region" are formed on a surface of the semiconductor substrate on both sides of the first exposed region so that the third region has a first exposed region being exposed on a surface of the semiconductor substrate;
  a step of forming each of the silicide layers being in contact with a surface of each of the first "second region," second "second region" and third "second region" so that the second "second region" and third "second region" are exposed successively so as to be in contact with the first exposed region of the first region;
  a step of forming a gate electrode constructed between the silicide layers formed in a manner so as to be in contact with the surfaces of the first "second region" and second "second region;"
  a step of forming one of a source electrode and a drain electrode being formed on one of the silicide layers formed in a manner so as to be in contact with the surface of the first "second region" and another of the source electrode and the drain electrode being formed on another out of the silicide layers formed in a manner so as to be in contact with the surface of the third "second region;"

wherein each of the silicide layers makes up a low resistance region having a relatively low resistance value, each of the second exposed regions in the second region makes up an intermediate resistance region having an intermediate resistance value, and the first exposed region in the third region makes up a high resistance region having a relatively high resistance value.

In the foregoing tenth, eleventh and/or twelfth aspects, a preferable mode is one wherein the second region are formed on a surface of the semiconductor substrate in a manner that the second region and the first region are overlapped.

Also, a preferable mode is one wherein, the first impurity concentration of the first region, when it is assumed that a well region is formed on the semiconductor substrate, is higher than that of the well region.

Also, a preferable mode is one wherein a surface length of the second exposed region is equal to or larger than a depth of the second region.

Also, a preferable mode is one wherein a surface length of the second exposed region is equal to or larger than a depth of the second region.

Also, a preferable mode is one that wherein further includes a step of forming a field oxide film formed on the first surface region or the first exposed region.

Also, a preferable mode is one that wherein further includes a step of forming a gate electrode structure on the first surface region or on the first exposed region.

With the above configuration, in a place surrounding the exposed region serving as the region having a high resistance value is formed a second exposed region serving as the region having an intermediate resistance value and in a place surrounding the second exposed region is formed a silicide layer serving as the regions having a low resistance value. Therefore, a resistance value of a semiconductor protection element changes in stages depending on a position and, as a result, no concentration of heat generation in a region having a high resistance value occurs. Thus, unlike in the case where the conventional semiconductor protection element is made up only of the region having a high resistance value, resistance to electrostatic breakdown can be increased.

With another configuration, the resistor element is made up of three kinds of resistance regions including a region having a high resistance value (exposed region), regions each having an intermediate value (second exposed region) and regions each having a low resistance value and, therefore, a desired resistance value can be achieved in a smaller area compared with the semiconductor protection element in which the resistor element is made up of regions having a low resistance value and regions each having an intermediate resistance value and an area of an entire semiconductor protection element can be made smaller.

With another configuration, three kinds of resistance regions are formed in a mixed manner, the resistor element or electrostatic protection circuit having a high resistance to electrostatic discharge (ESD) can be formed even in a smaller region.

BRIEF DESCRIPTION OF THE DRAWINGS

The above and other objects, advantages, and features of the present invention will be more apparent from the following description taken in conjunction with the accompanying drawings in which:

FIG. 16 is a cross-sectional view showing the semiconductor protection element according to the first embodiment of the present invention;

DETAILED DESCRIPTION OF THE PREFERRED EMBODIMENTS

Best modes of carrying out the present invention will be described in further detail using various embodiments with reference to the accompanying drawings.

First Embodiment

Figure 1:
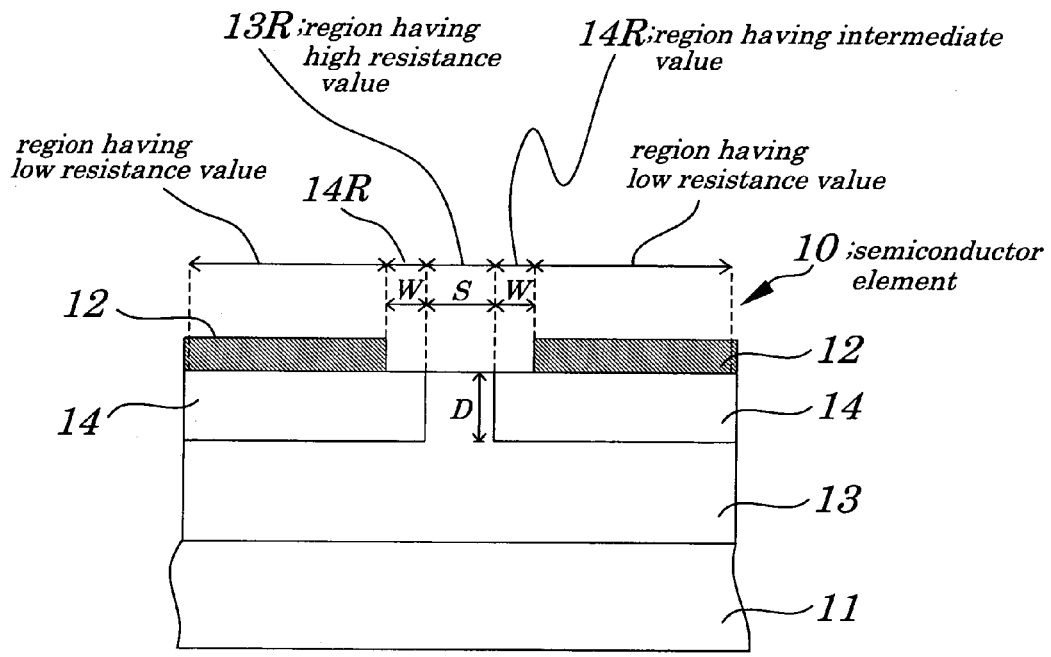
FIG. 1 is a cross-sectional view showing a semiconductor protection element according to a first embodiment of the present invention.

FIG. 1 is a cross-sectional view showing a semiconductor protection element 10 according to a first embodiment of the present invention.

The semiconductor protection element 10 according to the first embodiment includes a P-type semiconductor substrate 11 and silicide layers 12 formed on the P-type semiconductor substrate 11.

In the P-type semiconductor substrate 11, an N-type well 13, serving as a first region having a first impurity concentration being a relative low concentration and a pair of N+ diffusion layers 14, 14 each serving as a second region having a second impurity concentration being higher than the first impurity concentration of the N-type well 13. The N-type well 13, serving as the first region, has a first surface region being not covered with the silicide layers 12, and also the two N+ diffusion layers 14, 14, serving as the second region, has a second surface region being not covered with the silicide layers 12. The first surface region on the N-type well 13 is formed as a first exposed region 13R being exposed on a surface of the P-type semiconductor substrate 11 and the two second surface regions on the N+ diffusion layers 14 are formed as second exposed regions 14R being exposed on the surface of the P-type semiconductor substrate 11, in such a manner to surround/sandwich the first exposed region 13R.

Each of the silicide layers 12 is formed on each of the two N+ diffusion layers 14 serving as the second region in a manner that part of each of the two N+ diffusion layers 14 makes up each of the second exposed regions 14R each being exposed successively so as to be in contact with the first exposed region 13R.

One example of the first impurity concentration (of the N-type well 13) and one example of the second impurity concentration (of the N+ diffusion layer 14) are shown below.

First impurity concentration: $1 \times 10^{13}$ to $2 \times 10^{13}$ (cm-2)
Second impurity concentration: $1 \times 10^{15}$ to $6 \times 10^{15}$ (cm-2)

Moreover, the first exposed region 13R and second exposed regions 14R are so formed that all the length (hereinafter may be referred to as surface length) 2W of the second exposed region 14R on a surface of the P-type semiconductor substrate 11 is not shorter than a length S (surface length) of the first exposed region 13R on a surface of the P-type semiconductor substrate 11. That is, the surface lengths 2W of the second exposed regions 14R are almost equal to the surface length S of the first exposed region 13R, or the surface lengths 2W of the second exposed regions 14R are longer than the surface length S of the first exposed region 13R.

That is, $2W \approx S$ or $2W > S$.

When an ESD pulse is applied, Joule heat is generated. In order to prevent a breakdown caused by the Joule heat, it is necessary that the Joule heat is distributed in a wide area. An experiment and analysis made by the inventor of the present invention indicate that it is necessary that the area in which the heat is generated is doubled compared with that employed conventionally and breakdown resistance of a resistor element is doubled compared with that employed conventionally.

Figure 27:
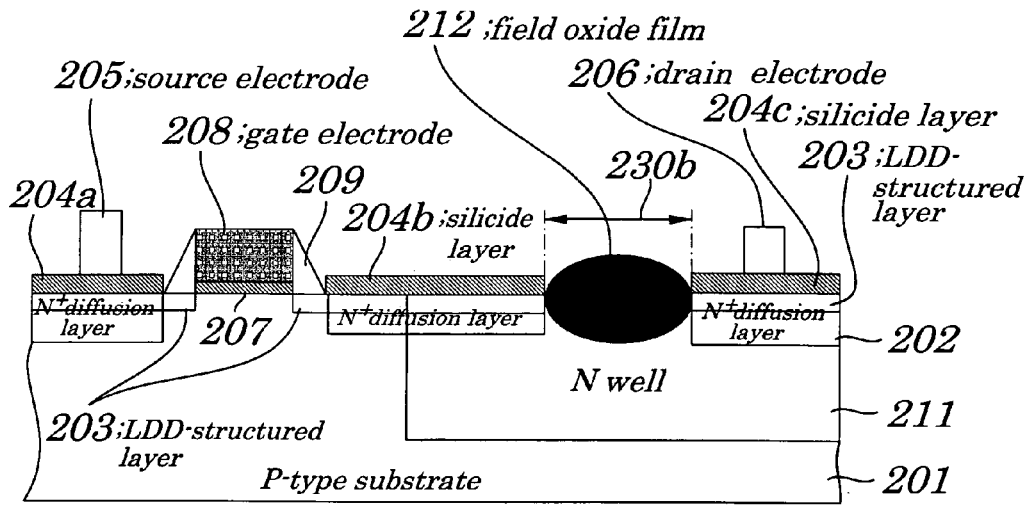
FIG. 27 is a cross-sectional view showing configurations of a second conventional semiconductor device.
Figure 28:
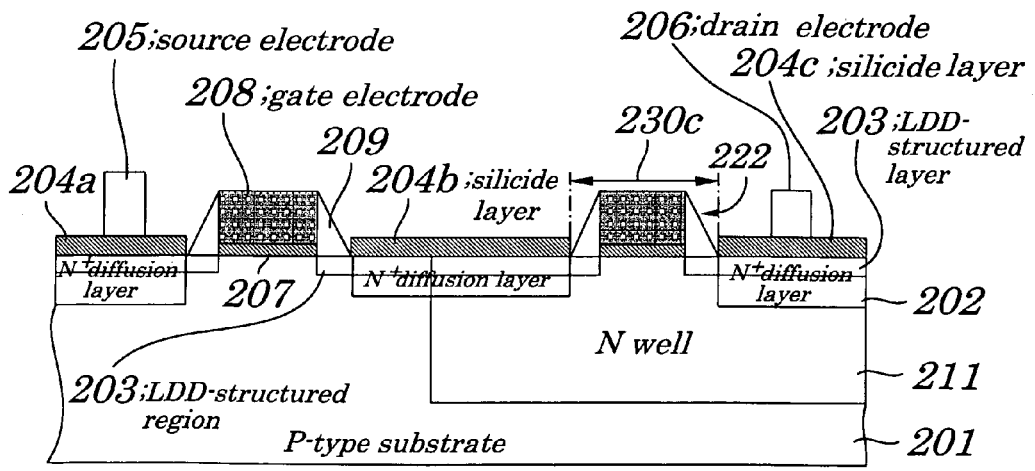
FIG. 28 is a cross-sectional view showing configurations of a third conventional semiconductor device.

In the conventional semiconductor device 210 shown in FIG. 27, heat is generated in the region 230b having a high resistance value. If a length of the region 230b having a high resistance value is defined as "S," a length of the heat generated region is expressed as "S."

On the other hand, in the semiconductor protection element 10 of the first embodiment shown in FIG. 1, regions in which heat is generated are the second exposed regions (each having an intermediate resistance value) 14R and the first exposed region (region having a high resistance value) 13R. That is, a length of the heat generated region is (2W+S). Therefore, by making setting so that the length 2W of the second exposed regions (region having an intermediate resistance value) is almost equal to or more than the length S of the first exposed region (region having a high resistance value) 13R, the expression that $2W+S \approx 2S$ or $2W+S > 2S$ can be satisfied. As a result, an area of the heat generated region can be doubled compared with that employed conventionally.

Moreover, the surface length W of each of the second exposed regions 14R is formed so as to be equal to a depth D of the N+ diffusion layer 14 or so as to be larger than the depth D. That is, $W \geq D$.

Figure 3A:
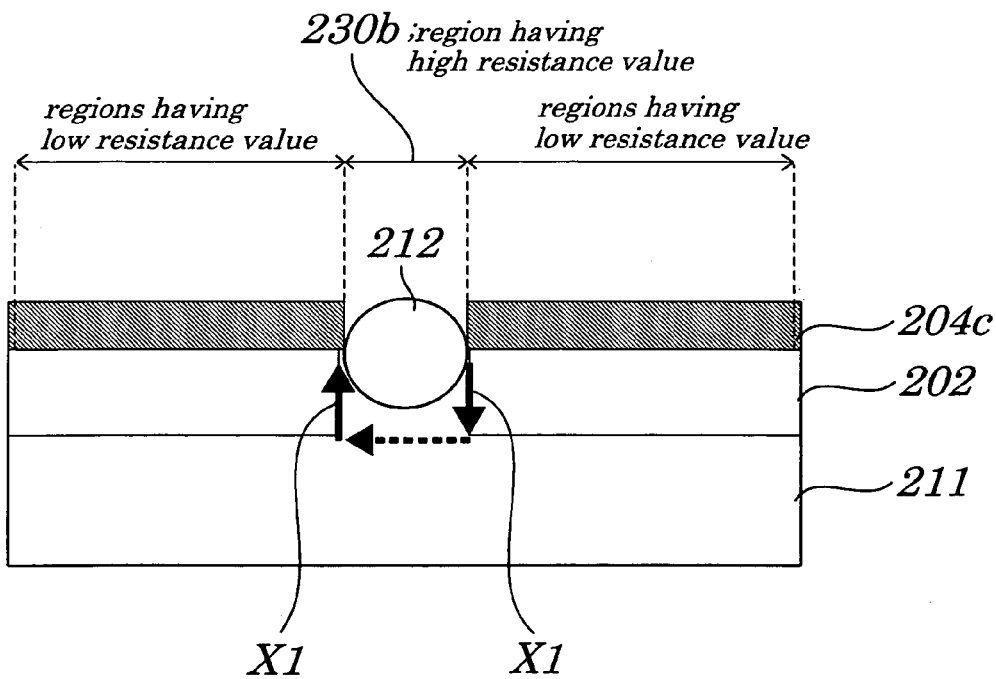
FIG. 3A is a diagram showing a path of a current in the conventional semiconductor protection element.
Figure 3B:
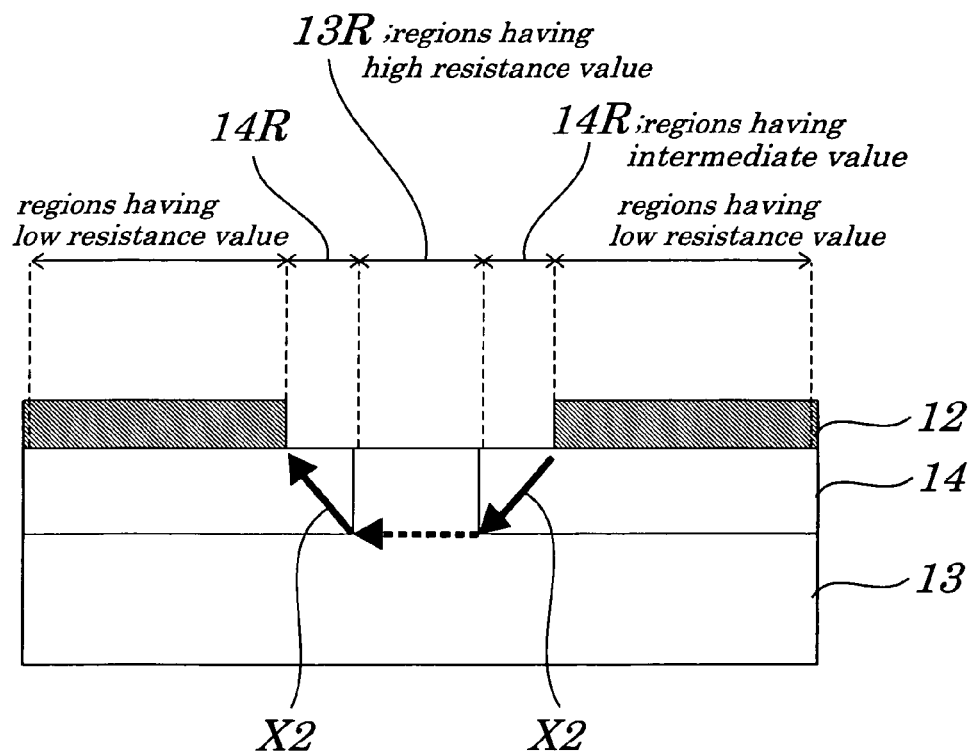
FIG. 3B is a diagram showing a path of a current in the semiconductor protection element according to the first embodiment.

FIG. 3A is a diagrammatic sketch showing a length L1' of a current path in the conventional semiconductor protection element (making up the semiconductor device 210) and FIG. 3B is a diagrammatic sketch showing a length L2' of a current path in the semiconductor protection element 10 according to the first embodiment of the present invention.

As shown in FIG. 3B, in regions having an intermediate resistance value 14R in the semiconductor protection element 10 of the first embodiment, a current flows along arrows X2.

Therefore, the length L2' of a path of currents flowing through the region 14R having an intermediate resistance value can be expressed as the following equation:

$$L2'=2\times(W2+D2)^{1/2}$$

On the other hand, even in the conventional semiconductor protection element, it does not occur that the currents do not flow at all through the N+ diffusion layer 202 and it can be thought that, during a process of the current flow in regions having a low resistance value, some currents flow through the N+ diffusion layer 202 along an arrow X1. In this case, a current path L1' is given as follows: L1'=2×D If the surface length W of the second exposed region (regions having an intermediate resistance value) 14R is very small than the length D of the N+ diffusion layer 14 (W<<D), the length L2' is given as follows: L2'=2×(W2+D2)½=2×(D2)½=2×D=L1'

That is, the length L2' of a path of a current, when W<<D, is equal to the length L1' of the path of the current in the conventional semiconductor protection element and, therefore, the semiconductor protection element 10 according to the first embodiment can acquire only the resistance value being equal to that obtained in the conventional semiconductor protection element.

Due to this, by making setting so as to be W≧D, the length of the path of currents flowing through the N+ diffusion layer 14 can be made longer than that employed in the conventional semiconductor protection element and, therefore, the breakdown resistance being larger than that obtained in the conventional semiconductor protection element can be obtained.

In the semiconductor protection element 10 of the first embodiment, each of the silicide layers 12 serves as a region having a low resistance value, each of the second exposed regions 14R in each of the N+ diffusion layers 14 as a region having an intermediate resistance value, and the first exposed region 13R in the N-type well 13 as a region having a high resistance value.

Figure 2:
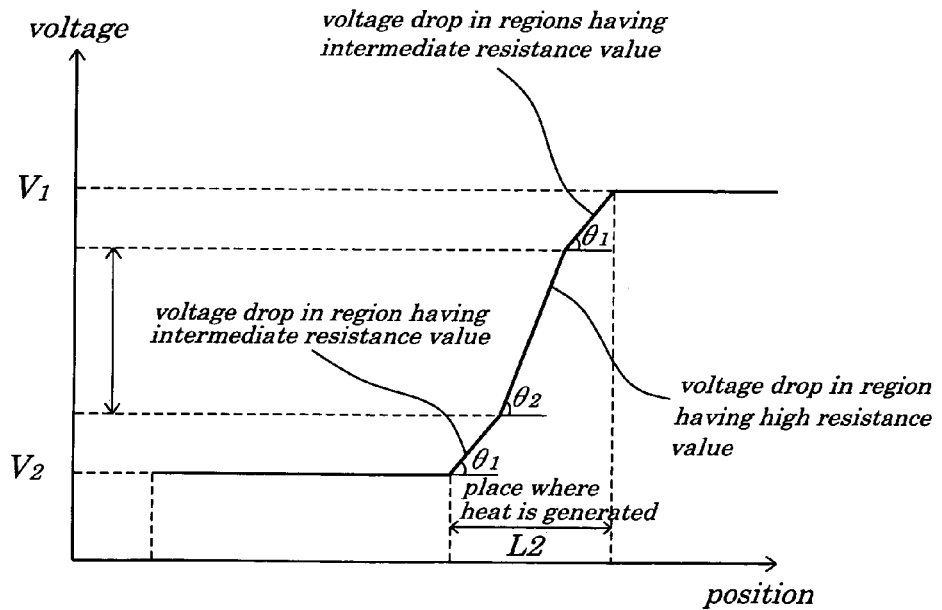
FIG. 2 is a graph showing relations among positions illustrated in the cross-sectional view of the semiconductor protection element according to the first embodiment in FIG. 1 and a voltage to be applied to each of the positions.
Figure 29A:
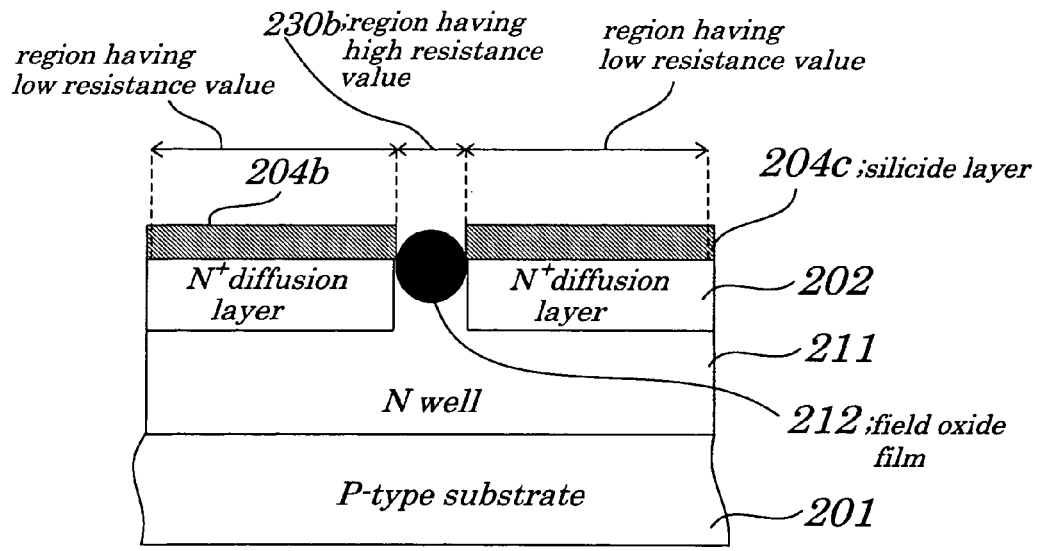
FIG. 29A is a cross-sectional view showing a field oxide film and regions surrounding the field oxide film making up the semiconductor device shown in FIG. 27.
Figure 29B:
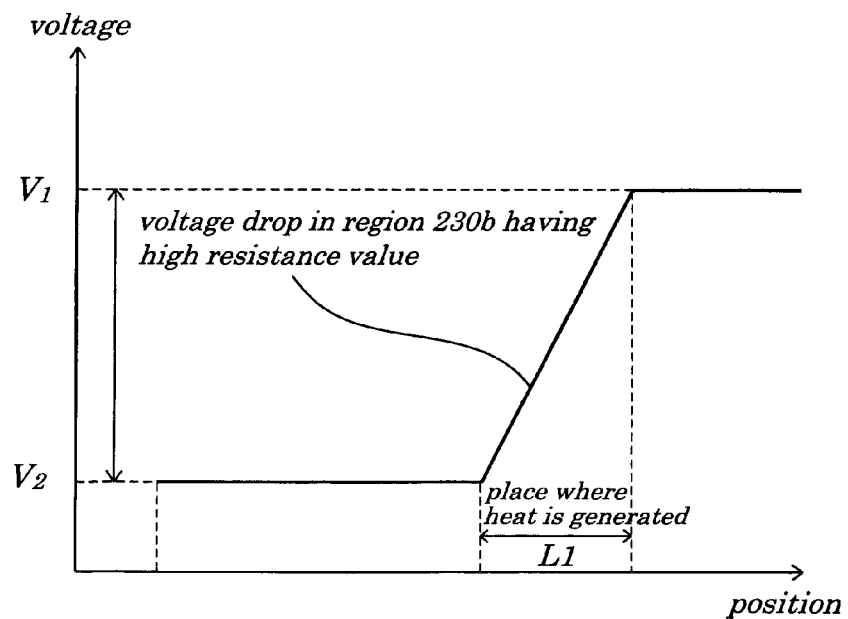
FIG. 29B is a graph showing a relation between a position corresponding to the region shown in FIG. 29A and a voltage to be applied.

FIG. 2 is a graph showing relations among positions illustrated in the cross-sectional view of the semiconductor protection element 10 of the first embodiment in FIG. 1 and voltages to be applied to each of the positions, which corresponds to the graph showing the same relation in the conventional semiconductor protection element in FIG. 29B.

As shown in FIG. 2, as in the case of the conventional semiconductor protection element (FIG. 29B), a voltage drop occurs in the second exposed regions 14R serving as the region having an intermediate resistance value and in the first exposed region 13R serving as the region having a high resistance value. However, in the graph shown in FIG. 29B, a gradient in a voltage drop is constant, while, in the graph shown in FIG. 2, a gradient θ1 in a voltage drop in each of the second exposed regions 14R serving as the region having an intermediate resistance value is different from a gradient θ2 in a voltage drop in each of the first exposed region 13R having a high resistance value. More particularly, the gradient θ1 in the voltage drop in each of the second exposed regions 14R serving as the region having an intermediate resistance value is smaller than the gradient θ2 in the voltage drop in each of the first exposed region 13R having a high resistance value.

Thus, since the gradient θ1 in the voltage drop in each of the second exposed regions 14R and the gradient θ2 in the voltage drop in the first exposed region 13R are different from each other, the region in which heat generation occurs as the result of the voltage drop from V1 to V2 in the semiconductor protection element 10 is wider than the region in which heat generation occurs as the result of the voltage drop from V1 to V2 in the conventional semiconductor protection element. When considered by substituting a one-dimensional amount, that is, a length for the above voltage drop, while the length of the region in which heat is generated in the conventional semiconductor protection element is L1 and the length of the region in which heat is generated in the semiconductor protection element 10 of the first embodiment is L2 and, since the gradients 1 of the resistance region is different from the gradient θ2 of the resistance region, the length L2 is longer than the length L1.

Due to this, even when an amount of the voltage drop in the conventional semiconductor protection element (making up the semiconductor device 210) is equal to an amount of the voltage drop in the semiconductor protection element 10 of the first embodiment, that is, an amount of heat generation caused by the voltage drop in the conventional semiconductor protection element is equal to an amount of the voltage drop in the semiconductor protection element 10 of the first embodiment, since the region in which heat is generated in the semiconductor protection element 10 of the first embodiment is wider than the region in which heat is generated in the conventional semiconductor device 210, concentration of heat generation in the region having a high resistance value (first exposed region 13R) can be suppressed and a rise in temperatures being smaller than that occurred in the conventional semiconductor protection element (making up the semiconductor device 210) can be achieved. Therefore, breakdown caused by heat generation in the region having a high resistance value can be prevented.

Thus, in the semiconductor protection element 10 according to the first embodiment, the regions having an intermediate resistance value (second exposed regions or second surface regions 14R) are formed in a place surrounding the region having a high resistance value (first exposed region or first surface region 13R) and the regions having a low resistance value (silicide layer 12) in a place surrounding the regions having an intermediate resistance value (second exposed regions or second surface regions 14R). Therefore, a resistance value of the semiconductor protection element 10 according to the first embodiment changes in stages depending on each of positions within the semiconductor protection element 10 and no concentration of heat generation occurs in the region having a high resistance value (first exposed region 13R or first surface region 13R). As a result, in the semiconductor protection element 10 of the first embodiment, unlike in the case of the conventional semiconductor protection element in which a resistor element made up of the region having a high resistance value is formed, resistance to electrostatic discharge (ESD) can be increased.

Moreover, in the semiconductor protection element 10 according to the first embodiment, since the resistor element is made up of three kinds of resistance regions including the region having a high resistance value (first exposed region or first surface region 13R), regions having an intermediate resistance value (second exposed regions or second surface regions 14R), and the regions (silicide layers 12) having a low resistance value, unlike in the case of the semiconductor protection element employing resistor elements made up of only regions having a low resistance value or regions having an intermediate resistance value, it is made possible to obtain a desired resistance value even in a smaller region which enables an entire area of the semiconductor protection element to be smaller.

Thus, in the semiconductor protection element 10 according to the first embodiment, since three kinds of resistance regions are formed in a mixed manner, the resistor element or electrostatic protection circuit having a high resistance to electrostatic discharge (ESD) can be formed even in a smaller area.

Figure 4A:
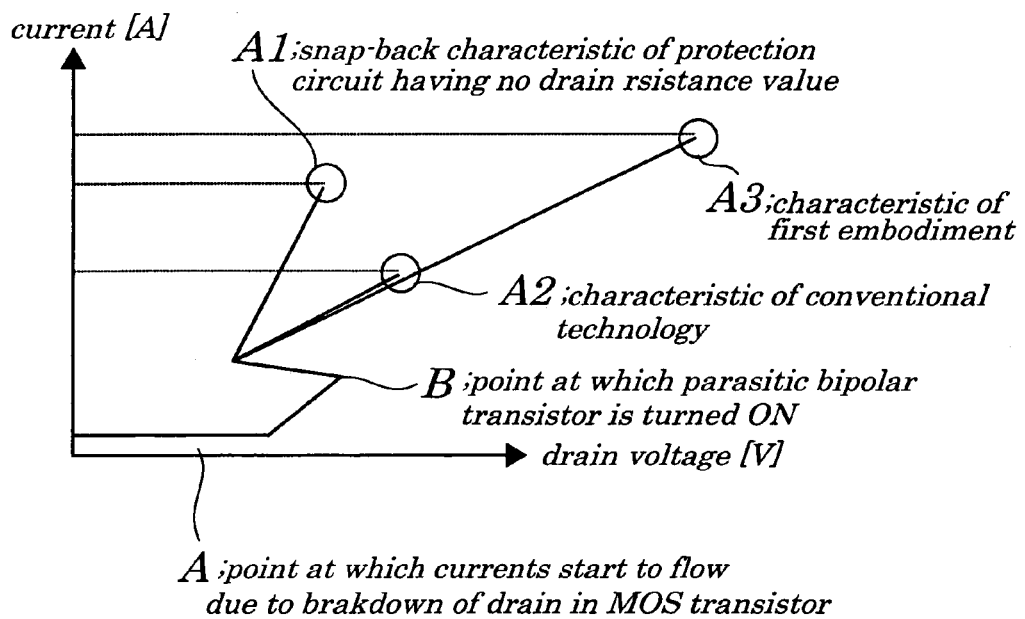
FIG. 4A is a graph showing current-drain voltage curves in the conventional semiconductor protection element and in the semiconductor protection element according to the first embodiment.
Figure 4B:
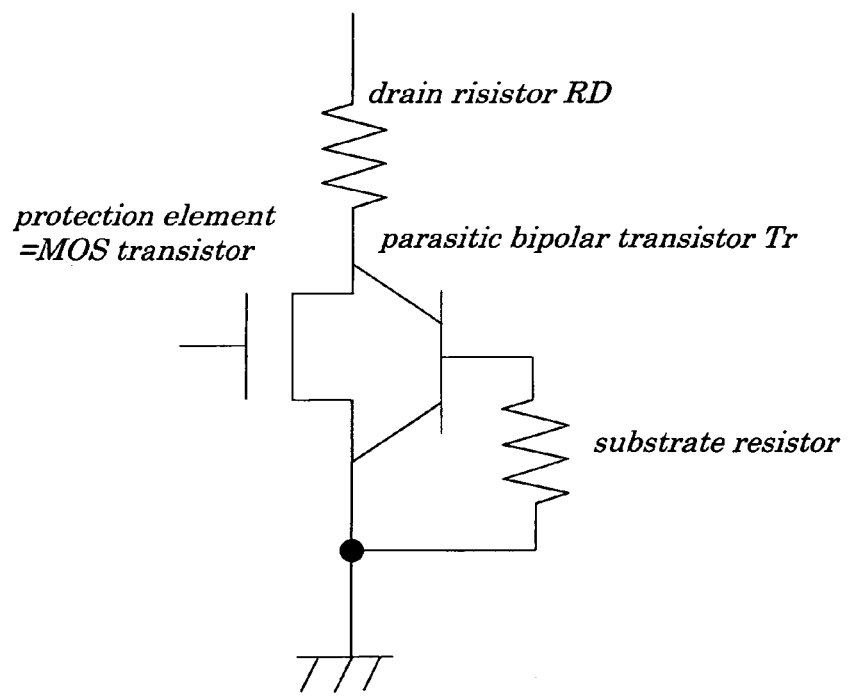
FIG. 4B is a diagram showing an equivalent circuit of the semiconductor protection element according to the first embodiment and the conventional semiconductor protection element respectively containing an electrostatic protection element.

Improvement of the resistance to electrostatic discharge (ESD) is described by referring to FIGS. 4A and 4B.

In FIG. 4A, a curve A1 shows a snap-back characteristic of a protection element having no drain resistance value, a curve A2 shows a snap-back characteristic of a semiconductor protection element being employed in the conventional semiconductor device 210, and a curve A3 shows a snap-back characteristic of a semiconductor protection element 10 being employed in the semiconductor device 110 according to the first embodiment, in which a current [A] is plotted as ordinate and a drain voltage [V] as abscissa. FIG. 4B shows an equivalent circuit diagram of a semiconductor device containing the semiconductor protection element.

In the example shown in FIG. 4B, the protection element is made up of a MOS (Metal Oxide Semiconductor) transistor.

If the MOS transistor serving as a protection element is broken down, a current flows from the drain to the substrate (point A).

As shown in FIG. 4B, since there is a parasitic resistance of a substrate between a drain and the substrate, when a current flows from the drain to the substrate, an operation referred to as a "snap-back" occurs in which a substrate rises in potential and a bipolar transistor Tr is turned ON (point B).

Thereafter, the current continues to flow until the parasitic bipolar transistor Tr or a drain resistor RD is broken down.

A slop of a characteristic curve occurring after the snap-back operation is determined according to a resistance value appearing when the parasitic bipolar transistor Tr is turned ON and to a resistance value of a drain.

The curve A1 in FIG. 4A is the characteristic curve obtained when the drain has no resistance and, therefore, the slope of the curve A1 is steep. However, the slopes of the curve A2 and curve A3, since the resistor is connected to the drain, are comparatively gentle.

As shown by the curve A2 in FIG. 4A, in the conventional semiconductor protection element, since heat is generated locally in a resistor element of a drain, a breakdown current is small when compared with a case in which the drain resistor does not exist (curve A1).

As shown by the curve A3 in FIG. 4A, in the semiconductor protection element 10 according to the first embodiment, since the resistance to breakdown in the resistor element can be improved, a value of the breakdown current becomes larger than that in the conventional semiconductor protection element. Improvement in values of the breakdown current enables the resistance to electrostatic breakdown of the semiconductor itself to be also improved.

FIGS. 5 to 16 are cross-sectional views illustrating manufacturing processes of the semiconductor protection element 10 of the first embodiment. By referring to FIGS. 5 to 16, one example of the manufacturing method of the semiconductor protection element 10 of the first embodiment is described below.

Figure 5:
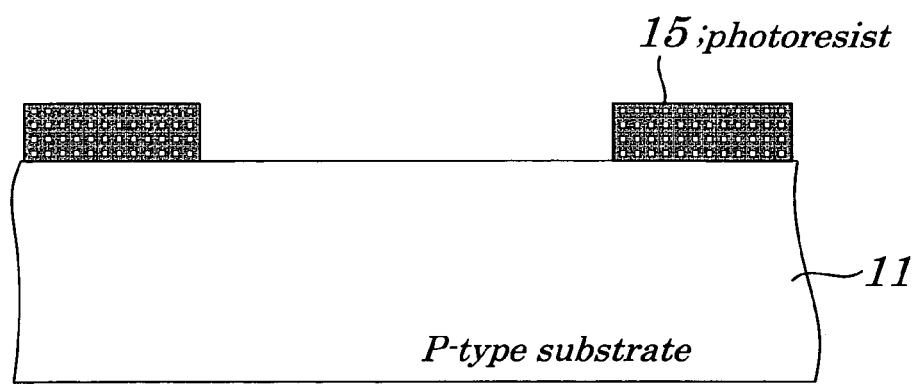
FIG. 5 is a cross-sectional view illustrating a manufacturing process of the semiconductor protection element according to the first embodiment shown in FIG. 1.

First, as shown in FIG. 5, a photoresist 15 having a specified pattern is formed on a surface of the P-type semiconductor substrate 11.

Figure 6:
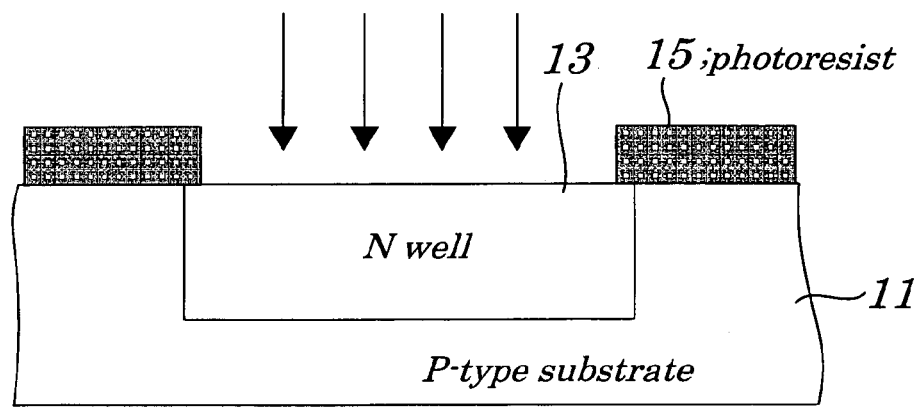
FIG. 6 is a cross-sectional view for illustrating the manufacturing process of the semiconductor protection element according to the first embodiment shown in FIG. 1.

Next, as shown in FIG. 6, by implanting an N-type impurity of low concentration into the P-type semiconductor substrate 11 using the photoresist 15 as a mask, an N-type well 13 serving as a first region of first impurity concentration is formed.

Figure 7:
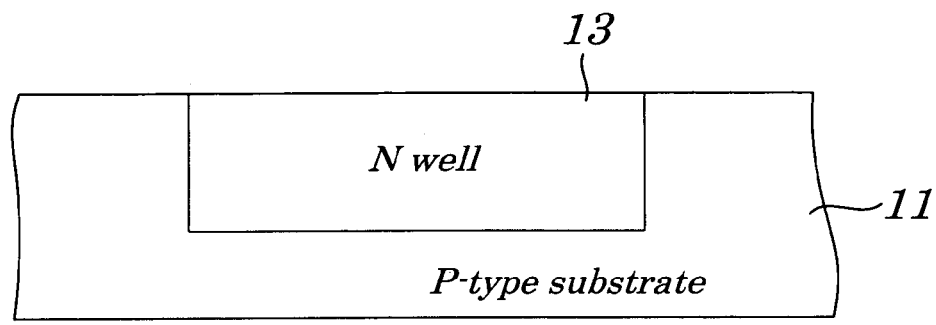
FIG. 7 is a cross-sectional view for illustrating the manufacturing process according to the semiconductor protection element of the first embodiment shown in FIG. 1.

Thereafter, as shown in FIG. 7, the photoresist 15 on the P-type semiconductor substrate 11 is removed.

Figure 8:
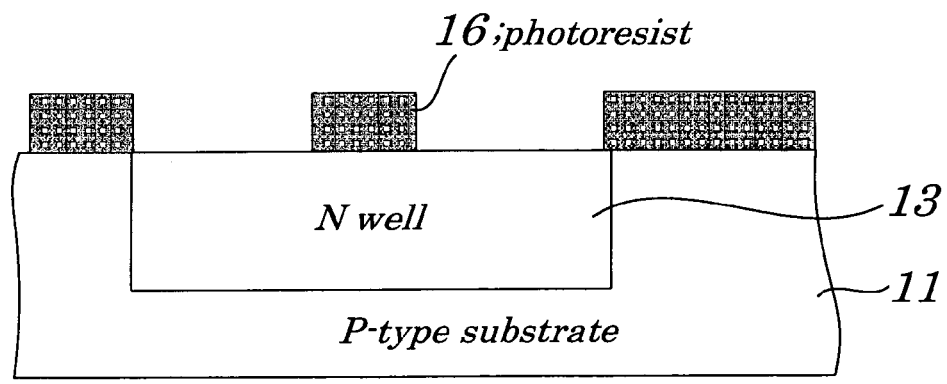
FIG. 8 is a cross-sectional view for illustrating the manufacturing process according to the semiconductor protection element of the first embodiment shown in FIG. 1.

Next, as shown in FIG. 8, a photoresist 16 having a pattern used to form N+ diffusion layers 14 serving as a second region is formed on a surface of the P-type semiconductor substrate 11.

Figure 9:
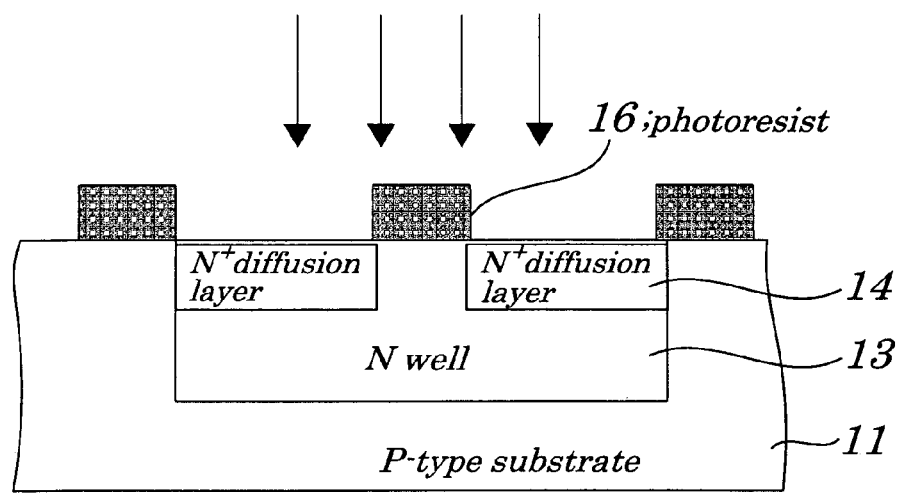
FIG. 9 is a cross-sectional view for illustrating the manufacturing process of the semiconductor protection element according to the first embodiment shown in FIG. 1.

Then, as shown in FIG. 9, by implanting an N-type impurity of a high concentration into the P-type semiconductor substrate 11 using the photoresist 16 as a mask, N+ diffusion layers 14 serving as a second region having an impurity concentration being higher than the first impurity concentration are formed in the N-type well 13.

Figure 10:
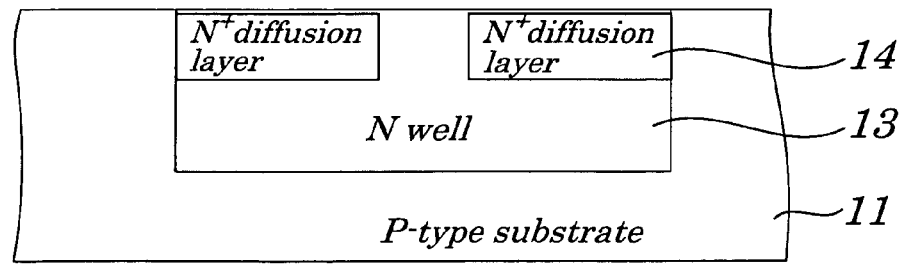
FIG. 10 is a cross-sectional view for illustrating the manufacturing process according to the semiconductor protection element of the first embodiment shown in FIG. 1.

After that, as shown in FIG. 10, the photoresist 16 on the P-type semiconductor substrate 11 is removed. At this stage, the N-type well 13 has a first exposed region (or first surface region) 13R being exposed on a surface of the P-type semiconductor substrate 11 and being formed so as to be sandwiched by two N+ diffusion layers 14.

Figure 11:
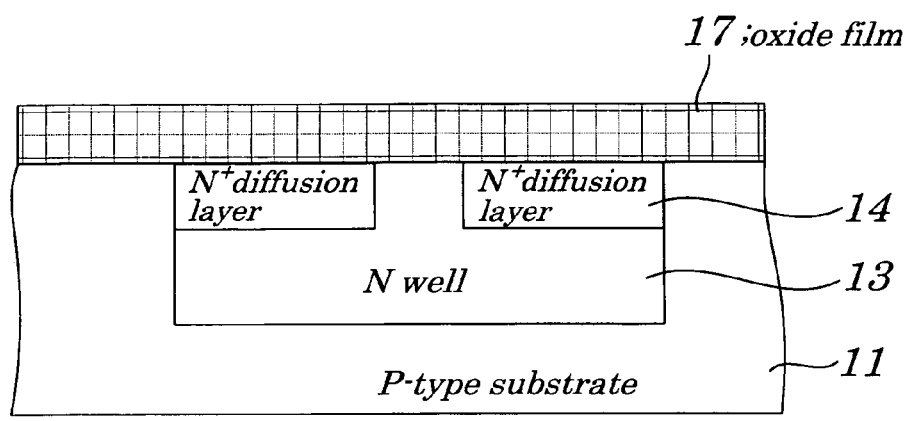
FIG. 11 is a cross-sectional view for illustrating the manufacturing process according to the semiconductor protection element of the first embodiment shown in FIG. 1.

Next, as shown in FIG. 11, a silicon oxide film 17 is formed on an overall surface of the P-type semiconductor substrate 11.

Figure 12:
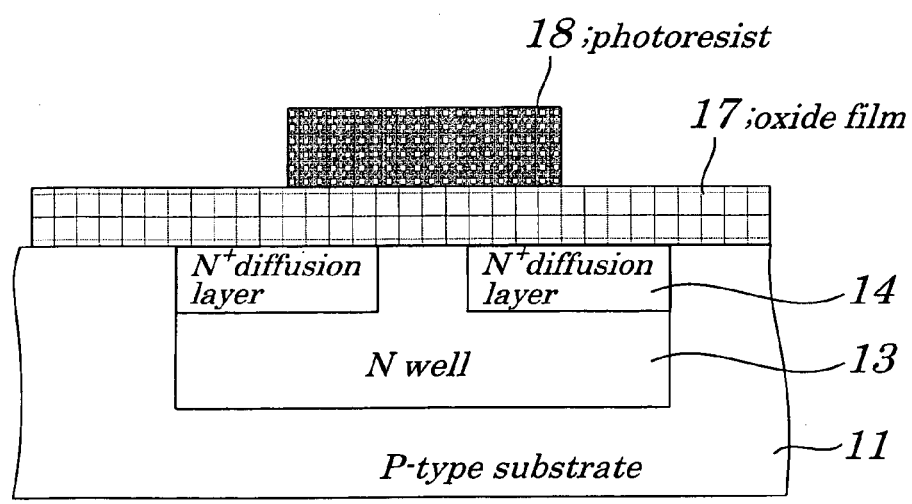
FIG. 12 is a cross-sectional view for illustrating the manufacturing process according to the semiconductor protection element of the first embodiment shown in FIG. 1.

Then, as shown in FIG. 12, a photoresist 18 having a pattern used to form the first exposed region (or the first surface region) 13R and the second exposed regions (or the second surface region) 14R are formed on the silicon oxide film 17.

Figure 13:
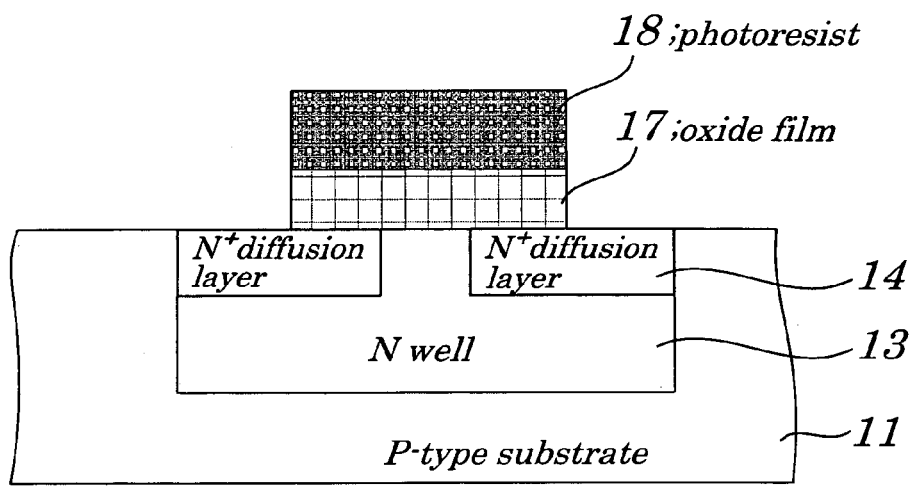
FIG. 13 is a cross-sectional view for illustrating the manufacturing process according to the semiconductor protection element of the first embodiment shown in FIG. 1.

Next, as shown in FIG. 13, the silicon oxide film 17 is etched using the photoresist 18 as a mask.

Figure 14:
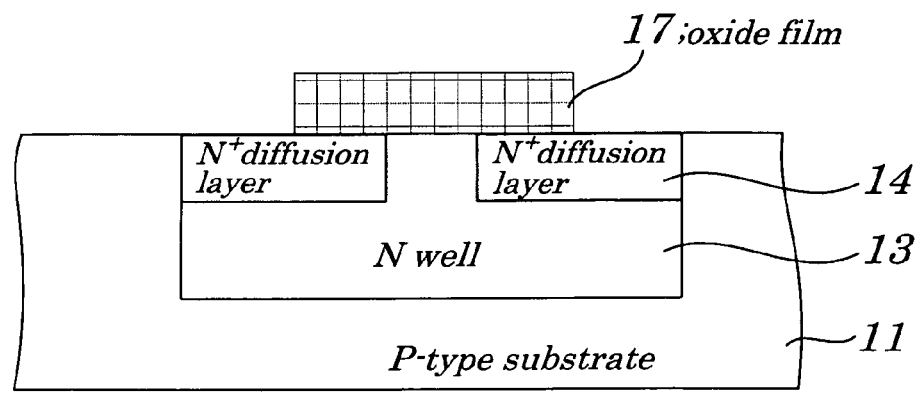
FIG. 14 is a cross-sectional view for illustrating the manufacturing process according to the semiconductor protection element of the first embodiment shown in FIG. 1.

After that, as shown in FIG. 14, the photoresist 18 on the silicon oxide film 17 is removed.

Figure 15:
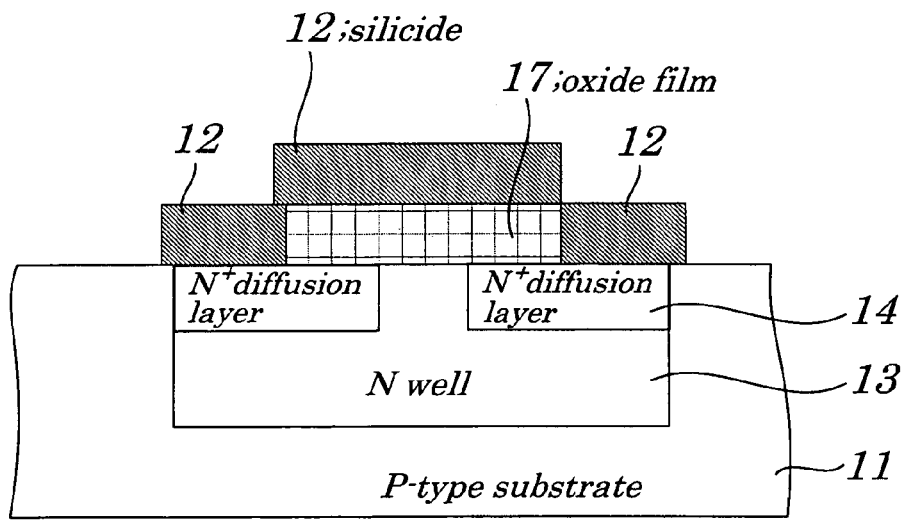
FIG. 15 is a cross-sectional view for illustrating the manufacturing process of the semiconductor protection element according to the first embodiment shown in FIG. 1.

Next, as shown in FIG. 15, a metal film is deposited on an entire surface of the P-type semiconductor substrate 11 and the silicon oxide film 17 by a sputtering method. After this, by performing heat treatment, the metal film on the P-type semiconductor substrate 11 and the silicon oxide film 17 reacts with silicon to form a silicide layer 12.

Figure 16:
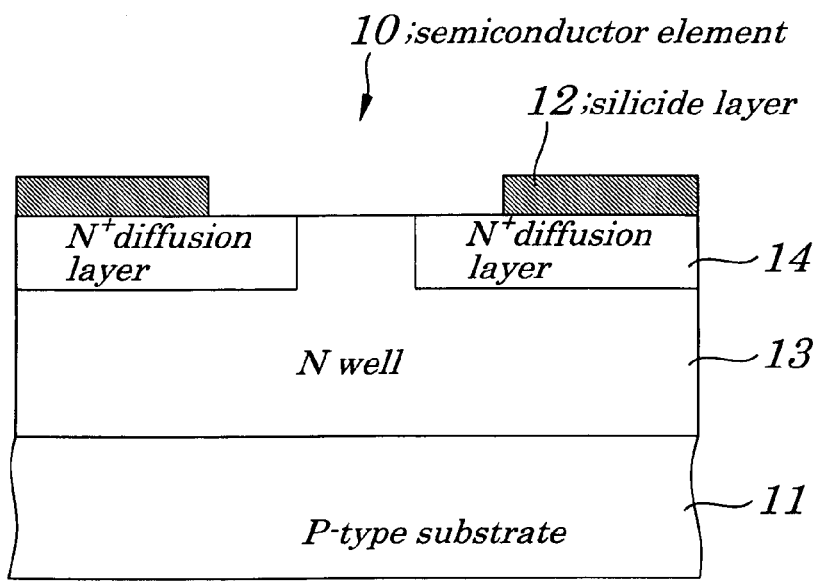
FIG. 16 is a cross-sectional view illustrating the manufacturing process of the semiconductor protection element according to the first embodiment shown in FIG. 1.

Then, as shown in FIG. 16, the silicon oxide film 17 and the silicide layer 12 on the silicon oxide film 17 are removed by an etching process. In this case, though the metal film on the silicon oxide film 17 is removed by a chemical reaction at a time of an etching process, since the silicide layer 12 produced by reaction between metal and silicon cannot be removed by etching easily and only the silicide layer 12 on the P-type semiconductor substrate 11 stays.

The semiconductor protection element 10 of the first embodiment shown in FIG. 1 is formed by processes described above.

Figure 17:
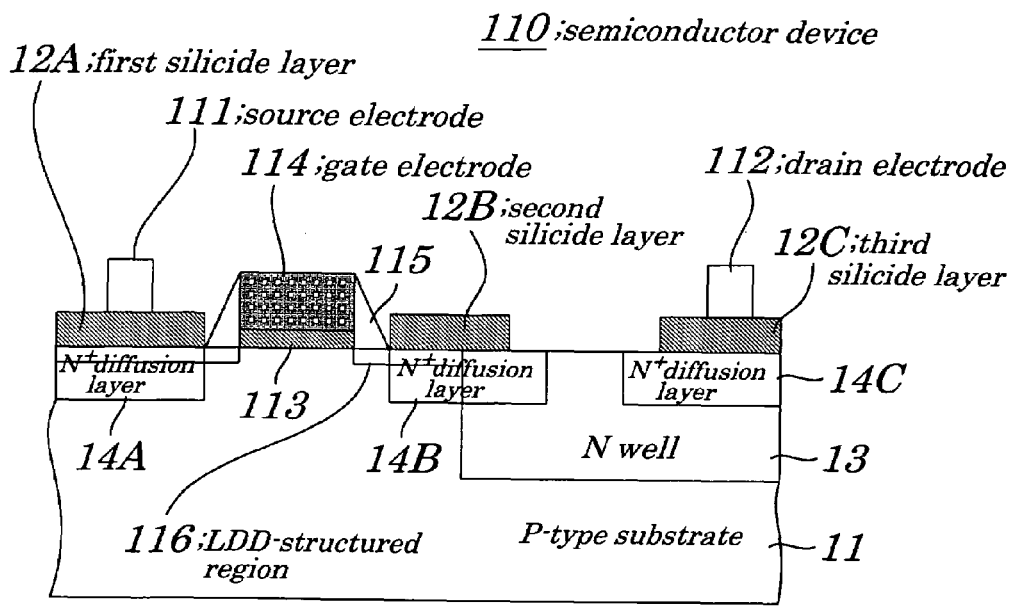
FIG. 17 is a cross-sectional view showing a semiconductor device having a semiconductor protection element according to the first embodiment of the present invention.

FIG. 17 is a cross-sectional view showing a semiconductor device 110 having a semiconductor protection element 10 of the first embodiment. Moreover, in FIG. 17, same reference numbers are assigned to components having the same function as those in the semiconductor protection element 10 in FIG. 1.

In the semiconductor device 110, a first N+ diffusion layer 14A, second N+ diffusion layer 14B, and third N+ diffusion layer 14C are formed on the P-type semiconductor substrate 11 and a first silicide layer 12A is formed on the first N+ diffusion layer 14A, a second silicide layer 12B on the second N+ diffusion layer 14B, and a third silicide layer 12C on the third N+ diffusion layer 14C.

The semiconductor device 110 shown in FIG. 17 is made up of the P-type semiconductor substrate 11, N-type well 13, second N+ diffusion layer 14B and third N+ diffusion layer 14C (these two N+ diffusion layers 14B and 14C correspond to the N+ diffusion layer 14 shown in FIGS. 5 to 16), second silicide layer 12B and third silicide layer 12C (these two silicide layers 12B and 12C correspond to the silicide layer 12 shown in FIGS. 5 to 16).

The first silicide layer 12A, unlike in the case of the second silicide layer 12B and the third silicide layer 12C, covers an entire surface of the first N+ diffusion layer 14A.

A source electrode 111 is formed on the first silicide layer 12A and a drain electrode 112 is formed on the third silicide layer 12C.

A gate electrode structure is provided in which a gate insulating film 113 is formed on the P-type semiconductor substrate 11 between the first silicide layer 12A and the second silicide layer 12B, a gate electrode 114 is formed on the gate insulating film 113, and a side wall 15 is formed in a place surrounding the gate insulating film 113 and gate electrode 114.

Moreover, in a place surrounding the gate insulating film 113 and on a surface of the P-type semiconductor substrate 11, an LDD-structured region 116 is formed.

The semiconductor device 110, since it has the structure of the semiconductor protection element 10 of the first embodiment, has effects provided by the semiconductor protection element 10 of the first embodiment. That is, in the semiconductor device 110, since the semiconductor protection element 10 has three kinds of resistance regions in a mixed manner, a resistor element or an electrostatic protection circuit having a high resistance to electrostatic discharge (ESD) is formed even in a smaller area.

One example of manufacturing methods for the semiconductor device 110 is described.

First, the N-type well 13 is formed on the P-type semiconductor substrate 11 by the same processes as those shown in FIGS. 5 to 7.

Next, the gate insulating film 113 and gate electrode 114 are formed on the P-type semiconductor substrate 11 by photolithography and dry etching.

Then, by using the gate electrode 114 as a mask, an N-type impurity is implanted into the P-type semiconductor substrate 11 to form the LDD-structured region 116.

Next, the side wall 115 is formed in a place surrounding the gate insulating film 113 and the gate electrode 114.

Then, the first, second and third N+ diffusion layers 14A, 14B, and 14C are formed by the same processes as shown in FIGS. 8 to 10. Here, when the first and second N+ diffusion layers 14A and 14B are formed, the gate electrode 114 and side wall 115 are used as a mask.

Next, the first, second and third silicide layers 12A, 12B, and 12C are formed, respectively, on the first, second, and third N+ diffusion layers 14A, 14B, and 14C by the same processes as shown in FIGS. 11 to 16. Here, when the first and second silicide layers 12A and 12B are formed, the gate electrode 114 and side wall 115 are used as a mask.

Then, by photolithography and dry etching, the source electrode 111 is formed on the first silicide layer 12A and the drain electrode 112 is formed on the third silicide layer 12C.

Through the above processes, the semiconductor device 110 shown in FIG. 17 is formed.

Moreover, in the above embodiment, the semiconductor protection element 10 is constructed using an N channel MOS transistor, however, by changing a conductive type of each of the substrate 11 and other components, the semiconductor protection element 10 according to the embodiment can be configured using a P channel MOS transistor.

Furthermore, the semiconductor protection element 10 of the first embodiment is constructed as an element on the P-type semiconductor substrate, however, it can be also constructed as an element on the N-type semiconductor substrate or an SOI (Silicon On Insulator).

Second Embodiment

Figure 18:
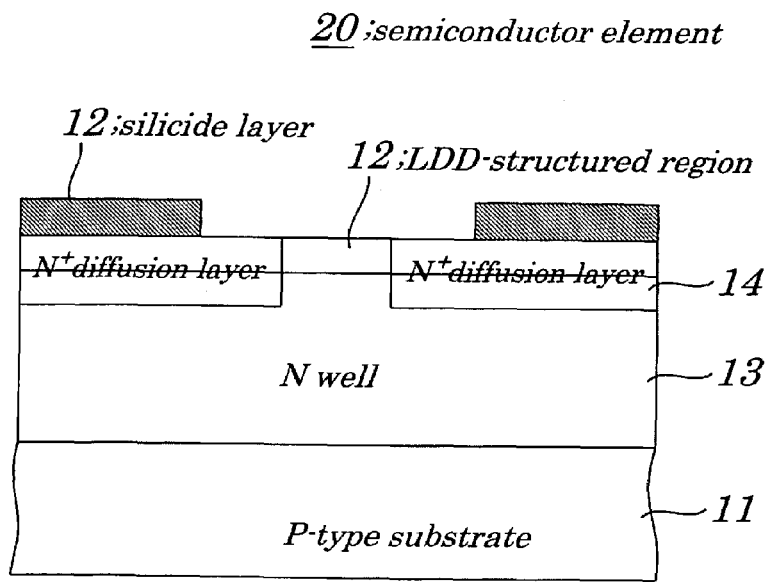
FIG. 18 is a cross-sectional view showing a semiconductor protection element according to a second embodiment of the present invention.

FIG. 18 is a cross-sectional view showing a semiconductor protection element 20 of the second embodiment of the present invention.

Configurations in a first region of the semiconductor protection element 20 of the second embodiment differ from those in the first region of the semiconductor protection element 10 shown in the first embodiment in FIG. 1.

In the semiconductor protection element 10 of the first embodiment, the first region is made up of the N-type well 13 only. However, in the semiconductor protection element 20 of the second embodiment, the first region is made up of an N-type well 13 and an LDD-structured region 21, serving as a third region, formed in a manner that the LDD-structured region and the N-type well are overlapped each other. Concentration of an impurity in the LDD-structured region 21 serving as the third region is higher than that in the N-type well 13 and lower than that in the N+ diffusion layer 14. Therefore, the first exposed region 13R making up a region having a high resistance value is made up of the LDD-structured region 21. On a surface of the P-type semiconductor substrate 11, the LDD-structured region 21, N-type well 13, and N+ diffusion layer 14 are overlapped one another.

The concentration of the impurity in the LDD-structured region 21 is, for example, $4 \times 10^{13}$ (cm-2) to $4 \times 10^{14}$ (cm-2).

Figure 20:
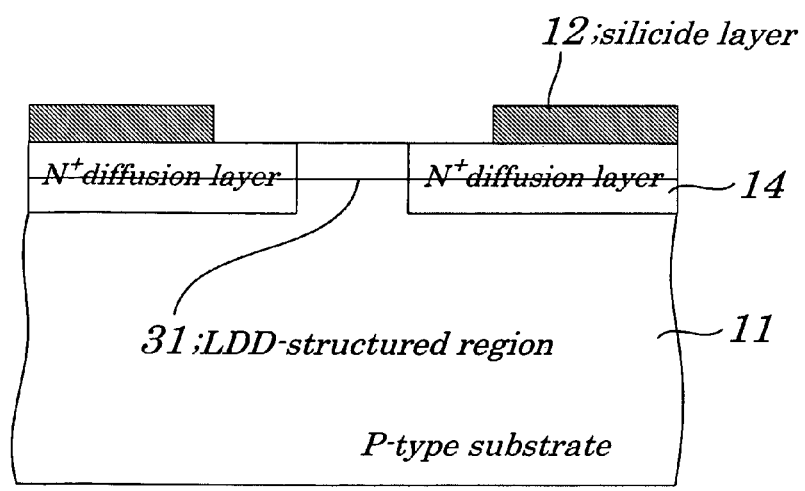
FIG. 20 is a cross-sectional view showing a semiconductor protection element according to a third embodiment of the present invention.

Thus, the structure of the semiconductor protection element 20 of the second embodiment is the same as the semiconductor protection element 10 of the first embodiment except that structures in their first regions are different from each other. In FIG. 20, same reference numbers are assigned to components having the same function as those in the semiconductor protection element 10 in FIG. 1.

When the concentration of the impurity in the N-type well 13 is compared with that in the LDD-structured region 21, the concentration of the impurity in the LDD-structured region 21 is generally larger than that in the N-type well 13. Therefore, a resistance value per unit length in the LDD-structured region 21 is smaller than that in the N-type well 13, an occupied area of the LDD-structured region 21 is larger than that of the N-type well 13 and a potential gradient in the LDD-structured region 21 is smaller than that in the N-type well 13. Therefore, in the semiconductor protection element 20 of the second embodiment, since the structure of the LDD-structured region 21 is added to that of the semiconductor protection element 10 of the first embodiment, larger resistance to electrostatic discharge (ESD) compared with the semiconductor protection element 10 of the first embodiment can be obtained.

One example of manufacturing methods for the semiconductor device 20 of the second embodiment is described below.

First, the N-type well 13 is formed on the P-type semiconductor substrate 11 by the same processes as those shown in FIGS. 5 to 7.

Next, an N-type impurity is implanted into the P-type semiconductor substrate 11 and then the LDD-structured region 21 is formed on a surface of the P-type semiconductor substrate 11.

Following the above processes, by performing the same processes as those employed in the semiconductor protection element 10 of the first embodiment, the manufacturing of the semiconductor protection element 20 of the first embodiment is finally completed.

Figure 19:
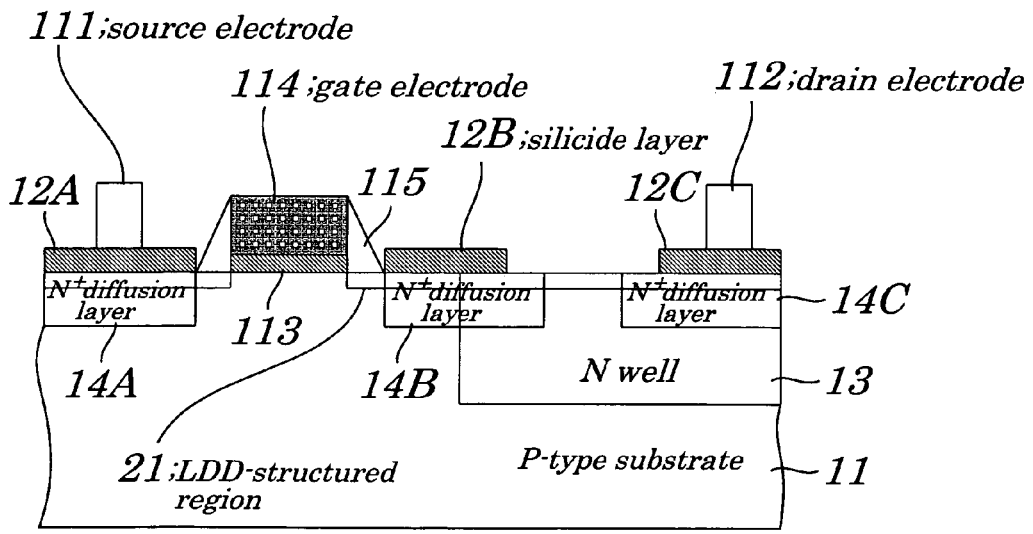
FIG. 19 is a cross-sectional view showing a semiconductor device having the semiconductor protection element according to the second embodiment.

FIG. 19 is a cross-sectional view showing a semiconductor device 120 having the semiconductor protection element 20 of the second embodiment. In FIG. 19, same reference numbers are assigned to components having the same function as those in the semiconductor device 110 shown in FIG. 17.

In the semiconductor device 110 shown in FIG. 17, the LDD-structured region 116 is formed, in a lower position of the second silicide layer 12B, from an end portion of the gate insulating film 113 (right end portion in FIG. 17) to a point where the LDD-structured region and the N-type well 13 are not overlapped each other. However, in the semiconductor device 120, the LDD-structured region 21 and the N-type well 13 are entirely overlapped each other. Except this point, the semiconductor device 120 has the same structure as the semiconductor device 110 shown in FIG. 17.

The semiconductor device 120, since it has a structure of the semiconductor protection element 20 of the second embodiment, can provide an effect obtained by the semiconductor protection element 20 of the second embodiment.

One example of manufacturing methods for the semiconductor device 120 is described below.

To manufacture the semiconductor device 120, a length of the LDD-structured region 116 employed in the semiconductor device 110 shown in FIG. 17 is changed. The semiconductor device 120 can be obtained by only changing the length of the LDD-structured region 116 without additional changes to other processes by the same processes as those for the semiconductor device 110.

Moreover, in the above embodiment, the semiconductor protection element 20 is constructed using an N channel MOS transistor, however, by reversing a conductive type of the substrate 11 and other components, the semiconductor protection element 20 of the embodiment can be constructed using a P channel MOS transistor.

Furthermore, the semiconductor protection element 20 of the second embodiment is constructed as an element on the P-type semiconductor substrate, however, it can be also constructed as an element on the N-type semiconductor substrate or an element on an SOI.

Third Embodiment

FIG. 20 is a cross-sectional view showing a semiconductor protection element 30 of the third embodiment of the present invention.

Configurations in a first region of the semiconductor protection element 30 of the third embodiment differ from those in the first region of the semiconductor protection element 10 shown in the first embodiment in FIG. 1.

In the semiconductor protection element 10 in the first embodiment shown in FIG. 1, the first region is made up of the N-type well 13, however, in the semiconductor protection element 30 of the third embodiment, the first region is made up of the LDD-structured region 31 formed on a surface of the P-type semiconductor substrate 11. That is, the first exposed region 13R making a region having a high resistance value is made up of the LDD-structured region 31.

On a surface of the P-type semiconductor substrate 11, the LDD-structured region 31 and the N+ diffusion substrate 11 are overlapped each other.

The impurity concentration in the LDD-structured region 31 is, for example, $4 \times 10^{13}$ to $4 \times 10^{14}$ (cm-2).

Thus, the semiconductor protection element 30 of the third embodiment has the same configuration as the semiconductor protection element 10 of the first embodiment, except that configurations of the first region are different between them. In FIG. 20, same reference numbers are assigned to the same components as those in the semiconductor protection element 10 shown in FIGS. 5 to 16.

In the semiconductor protection element 30 of the third embodiment, as in the case of the semiconductor protection element 10 of the first embodiment, a resistor element is made up of three kinds of resistance regions including a region having a high resistance value (exposed region 13R), a region having an intermediate resistance value (second exposed region 14R) and a region having a low resistance value (silicide layer 12). This enables the formation of a resistor element or an electrostatic protection circuit having a high resistance to ESD in a smaller area.

One example of manufacturing methods for the semiconductor device 30 is described below.

First, by the same processes as shown in FIGS. 5 to 7, the LDD-structured region 31 is formed, instead of the N-type well 13, on the P-type semiconductor substrate 11.

Following the above processes, by performing the same processes as those in the semiconductor protection element 10 of the first embodiment, the manufacturing of the semiconductor protection element 30 of the third embodiment is finally completed.

Figure 21:
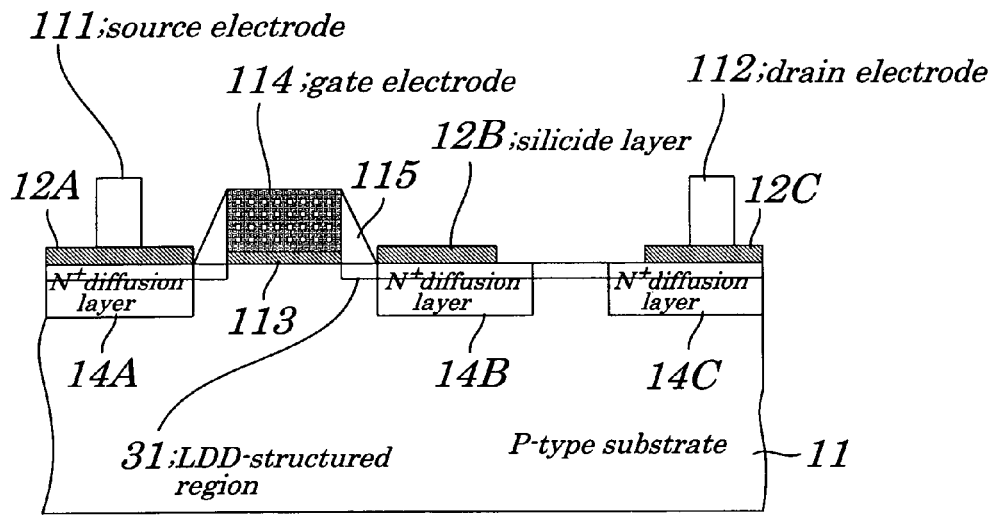
FIG. 21 is a cross-sectional view showing a semiconductor device having the semiconductor protection element according to the third embodiment of the present invention.

FIG. 21 is a cross-sectional view showing a semiconductor device 130 having the semiconductor protection element 30 of the third embodiment. In FIG. 21, same reference numbers are assigned to components having the same function as those in the semiconductor device 110 shown in FIG. 17.

In the semiconductor device 110 shown in FIG. 17, the LDD-structured region 116 is formed, in a lower position of the second silicide layer 12B, from an end portion of the gate insulating film 113 (right end portion in FIG. 17) to a point where the LDD-structured region and the N-type well 13 are partially overlapped each other. However, in the semiconductor device 130, as in the case of the semiconductor device 120 shown in FIG. 19, the LDD-structured region 31, second N+ diffusion layer 14B, and third N+ diffusion layer 14C are entirely overlapped each other.

Moreover, in the semiconductor device 130, unlike in the case of the semiconductor device 110, the N-type well 13 is not formed.

Except these points, the semiconductor device 130 has the same configuration as the semiconductor device 110 shown in FIG. 17.

The semiconductor device 130, since it has the structure of the semiconductor protection element 30 of the first embodiment, provides the effect obtained in the semiconductor protection element 30 of the first embodiment.

One example of manufacturing methods for the semiconductor device 130 of the third embodiment is described below.

The semiconductor device 130 can be manufactured by performing all the processes employed in the manufacturing methods for the semiconductor device 120 shown in FIG. 19 except the processes of forming the N-type well 13.

Moreover, in the above embodiment, the semiconductor protection element 30 of the third embodiment is constructed using an N channel MOS transistor, however, by reversing a conductive type of the substrate 11 and other components, the semiconductor protection element 30 of the third embodiment can be constructed using a P channel MOS transistor.

Furthermore, the semiconductor protection element 30 of the third embodiment is constructed as an element on the P-type semiconductor substrate, however, it can be also constructed as an element on the N-type semiconductor substrate or an SOI.

Fourth Embodiment

Figure 22:
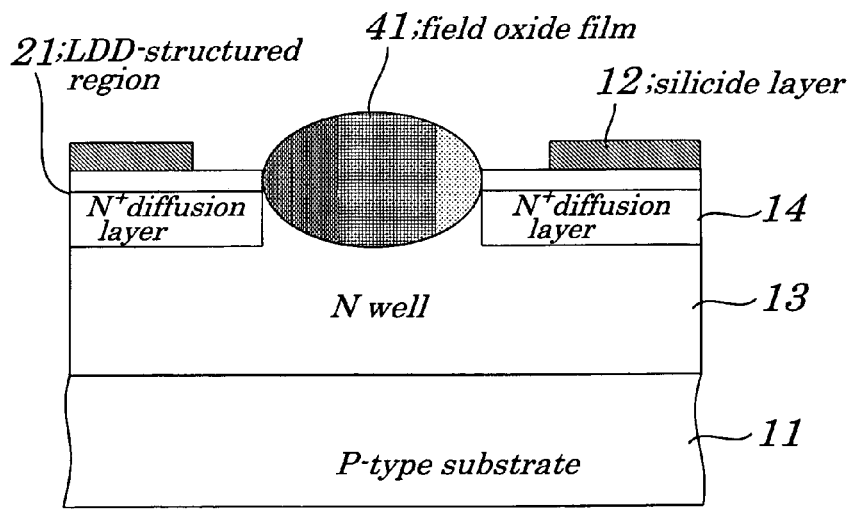
FIG. 22 is a cross-sectional view showing a semiconductor protection element according to a fourth embodiment of the present invention.

FIG. 22 is a cross-sectional view showing a semiconductor protection element 40 of the fourth embodiment of the present invention.

The semiconductor protection element 40 of the fourth embodiment differs from the semiconductor protection element 20 of the second embodiment shown in FIG. 18 in following points.

That is, in the semiconductor protection element 40 of the fourth embodiment, a field oxide film 41, instead of the LDD-structured region 21 making up the first exposed region (first surface region) 13R in the semiconductor protection element 20 shown in FIG. 18 is formed. Except this point, the semiconductor protection element 40 of the fourth embodiment has the same structure as the semiconductor protection element 20 of the second embodiment.

Thus, by forming the field oxide film 41, the first exposed region 13R disappears, however, since the field oxide film 41 functions as the first exposed region 13R, the semiconductor protection element 40 of the fourth embodiment has the same function as the semiconductor protection element 10 of the first embodiment. That is, in the semiconductor protection element 40 of the fourth embodiment, since three kinds of resistance regions are formed in a mixed manner, the resistor element or electrostatic protection circuit having a high resistance to ESD can be formed even in a smaller area.

Moreover, the semiconductor protection element 40 of the fourth embodiment is structured based on the semiconductor protection element 20 of the second embodiment. However, the semiconductor protection element 40 of the fourth embodiment can be structured based on the semiconductor protection element 10 of the first embodiment or based on the semiconductor protection element 30 of the third embodiment.

That is, the field oxide film 41 can be formed in the first exposed region 13R in the N-type well 13 in the semiconductor protection element 10 of the first embodiment or in the first exposed region 13R in the LDD-structured region 31 in the semiconductor protection element 30 in the third embodiment.

One example of manufacturing methods for the semiconductor device 40 of the fourth embodiment is described below.

First, the N-type well 13 is formed on the P-type semiconductor substrate 11 by the same processes as those shown in FIGS. 5 to 7.

Next, the field oxide film 41 is formed in the N-type well 13 by using a know method.

Following the above processes, by performing the same processes as those in the semiconductor protection element 20 of the second embodiment, the manufacturing of the semiconductor protection element 40 of the fourth embodiment is finally completed. Moreover, the field oxide film 41, when the LDD-structured region 21 and the N+ diffusion layer 14 are formed, can be used as a mask.

Figure 23:
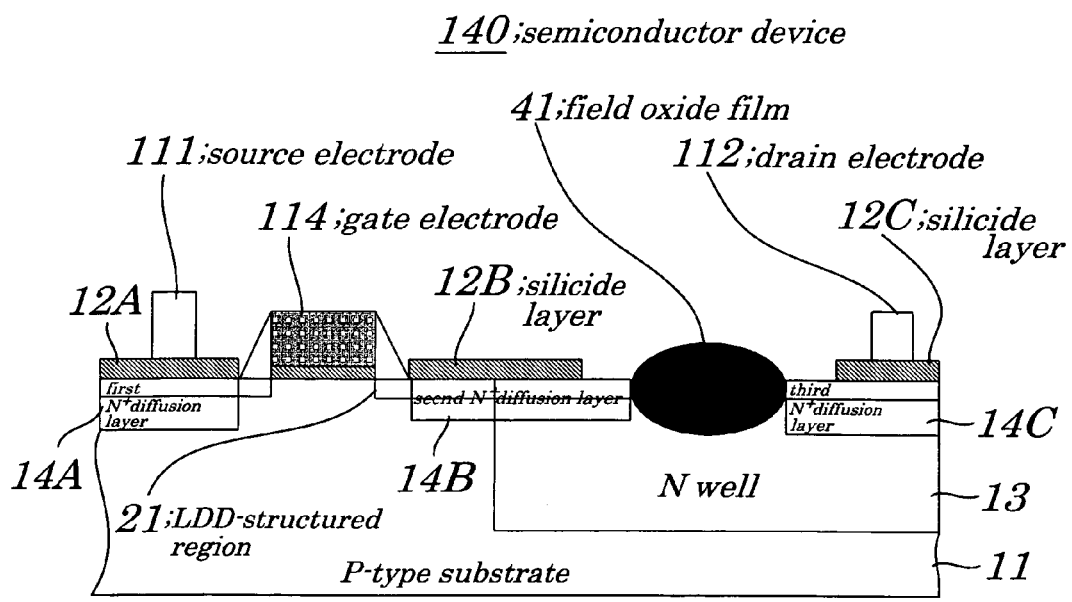
FIG. 23 is a cross-sectional view showing a semiconductor device having the semiconductor protection element according to the fourth embodiment of the present invention.

FIG. 23 is a cross-sectional view showing a semiconductor device having the semiconductor protection element of the fourth embodiment. In FIG. 23, same reference numbers are assigned to components having the same function as those in the semiconductor protection element 120 in FIG. 19.

Unlike in the case of the semiconductor device 120 shown in FIG. 19 in which the LDD-structured region 21 making up the first exposed region 13R is formed between the second N+ diffusion layer 14 and the third N+ diffusion layer 14C, in the semiconductor device 140 in FIG. 23, the field oxide film 41 is formed between the second N+ diffusion layer 14 and the third N+ diffusion layer 14C. Except this point, the semiconductor device 140 shown in FIG. 23 has the same structure as the semiconductor device 120 shown in FIG. 19.

The semiconductor device 140, since it has the structure of the semiconductor protection element 40 of the fourth embodiment, has effects provided by the semiconductor protection element 40 of the fourth embodiment.

One example of manufacturing methods for the semiconductor device 140 of the fourth embodiment is described below.

First, after an N-type well 13 has been formed on the P-type semiconductor substrate 11, the field oxide film 41 is formed in the N-type well 13 by a known method. The semiconductor device 140 can be manufactured by performing the same processes as employed in the manufacturing method of the semiconductor device 120. Moreover, the field oxide film 41, when the LDD-structured region 21, second N+ diffusion layer 14B, and third N+ diffusion layer 14C are formed, can be used as a mask.

Moreover, in the above embodiment, the semiconductor protection element 40 is constructed using an N channel MOS transistor, however, by reversing a conductive type of the substrate 11 and other components, the semiconductor protection element 40 of the fourth embodiment can be constructed using a P channel MOS transistor.

Furthermore, the semiconductor protection element 40 of the fourth embodiment is constructed as an element on the P-type semiconductor substrate, however, it can be also constructed as an element on the N-type semiconductor substrate or an SOI.

Fifth Embodiment

Figure 24:
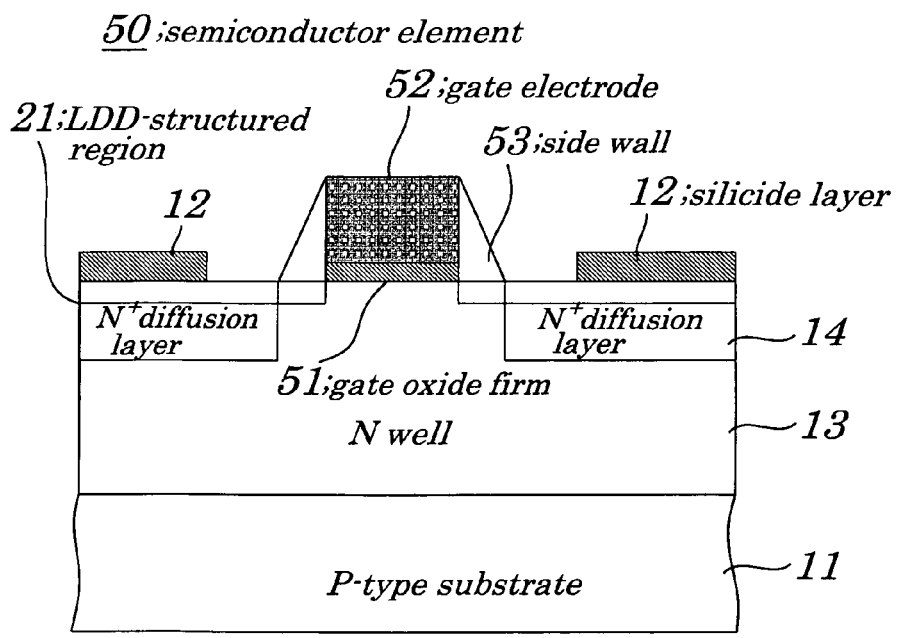
FIG. 24 is a cross-sectional view showing a semiconductor protection element according to a fifth embodiment of the present invention.

FIG. 24 is a cross-sectional view showing a semiconductor protection element 50 of the fifth embodiment of the present invention.

The semiconductor protection element 50 of the fifth embodiment differs from the semiconductor protection element 20 of the second embodiment shown in FIG. 18 in following point.

That is, a gate electrode structure is provided which includes a gate oxide film 51 formed in the first exposed region (first surface region) on the P-type semiconductor substrate 11, a gate electrode 52 formed on the gate oxide film 51, and a side wall 53 formed in a place surrounding the gate oxide film 51 and gate electrode 52 as shown in FIG. 24. The LDD-structured region 21 is not formed in a region in a lower position of the gate oxide film 51. Except this point, the semiconductor protection element 50 in the fifth embodiment shown in FIG. 24 has the same structure as the semiconductor protection element 20 in the second embodiment shown in FIG. 18.

In the semiconductor protection elements 10, 20, and 30 in the first, second, and third embodiments, the region having a high resistance value 13R is determined by a mask pattern to be employed in a process of implanting a high-concentration N-type impurity making up the N+ diffusion layer 14.

Unlike in the above case, in the semiconductor protection element 50 of the fifth embodiment, a region 13R having a high resistance value is determined by a position of a polycrystalline silicon formed on a P-type substrate. Since this polycrystalline silicon is formed in a process in which the gate electrode 52 of the transistor is formed, it is possible to process with higher accuracy and more finely when compared with a mask pattern to be employed in a process of implanting high-concentration N-type impurity making up the N+ diffusion layer 14. Therefore, the semiconductor protection element 50 of the fifth embodiment can be designed with higher accuracy and more finely compared with the first, second, and third semiconductors 10, 20, and 30.

One example of manufacturing methods for the semiconductor device 50 of the fifth embodiment is described below.

First, the N-type well 13 is formed on the P-type semiconductor substrate 11 by the same processes as those shown in FIGS. 5 to 7.

Next, the gate insulating film 51 and gate electrode 52 are formed on the P-type semiconductor substrate 11 by photolithography and dry etching.

Then, by using the gate electrode 52 as a mask, an N-type impurity is implanted into the P-type semiconductor substrate 11 and the LDD-structured region 21 is formed.

Next, a side wall 53 is formed in a place surrounding the gate insulating film 51 and the gate electrode 52.

Then, the N+ diffusion layer 14 is formed by the same processes shown in FIGS. 8 to 10. In this case, when the N+ diffusion layer 14 is formed, the gate electrode 52 and the side wall 53 function as a mask.

The silicide layer 12 is formed on the N+ diffusion layer 14 by the same processes as those shown in FIGS. 11 to 16.

Through the above process, the semiconductor device 50 shown in FIG. 24 is fabricated.

Figure 25:
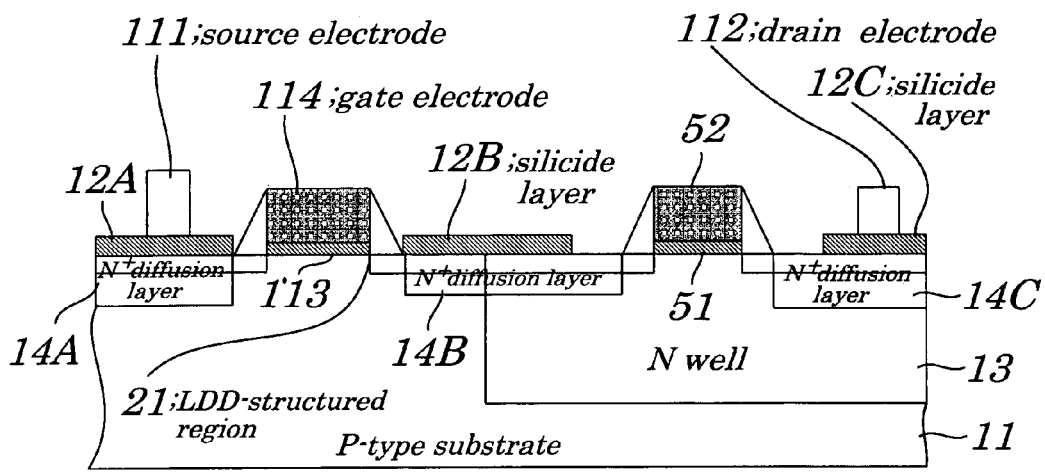
FIG. 25 is a cross-sectional view showing a semiconductor device having the semiconductor protection element according to the fifth embodiment of the present invention.
Figure 26:
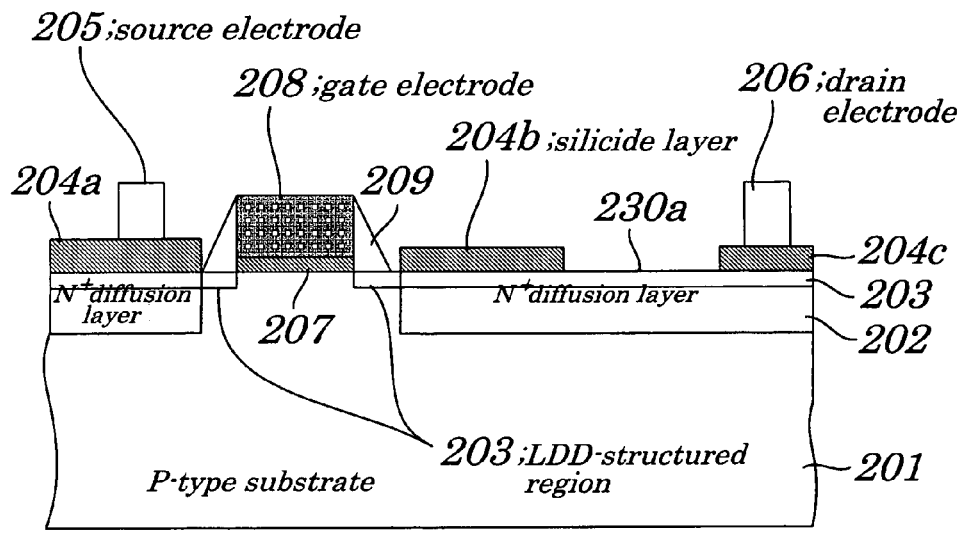
FIG. 26 is a cross-sectional view showing configurations of a first conventional semiconductor device.

FIG. 25 is a cross-sectional view showing a semiconductor device 150 having the semiconductor protection element 50 of the fifth embodiment. Moreover, in FIG. 25, same reference numbers are assigned to components having the same function as those in the semiconductor device 120 in FIG. 19.

In the semiconductor device 150, a gate electrode structure is provided which includes a gate oxide film 51 formed in the first exposed region (first surface region) on the P-type semiconductor substrate 11, a gate electrode 52 formed on the gate oxide film 51, and a side wall 53 formed in a place surrounding the gate oxide film 51 and gate electrode 52 as shown in FIG. 25. The LDD-structured region 21 is not formed in a region in a lower position of the gate oxide film 51. Except this point, the semiconductor device 150 in the fifth embodiment shown in FIG. 25 has the same structure as the semiconductor protection element 120 in the second embodiment shown in FIG. 19.

The semiconductor device 150, since it has the structure of the semiconductor protection element 50 of the fifth embodiment, has effects provided by the semiconductor protection element 50 of the fifth embodiment.

One example of manufacturing methods for the semiconductor device 150 of the fifth embodiment is described below.

When the semiconductor device 120 shown in FIG. 19 is manufactured, a gate electrode structure made up of the gate oxide film 113, gate electrode 114, and side wall 115 is formed between the first silicide layer 12A and second silicide layer 12B. However, when the semiconductor device 150 is manufactured, a gate electrode structure made up of a gate oxide film 51, gate electrode 52, and side wall 53 are formed and the above gate electrode structure as shown in FIG. 19 are formed at the same time. Except this, the semiconductor device 150 can be manufactured by performing the same processes as those in the semiconductor device 120.

Moreover, the semiconductor protection element 50 of the fifth embodiment is constructed using an N channel MOS transistor, however, by reversing a conductive type of the substrate 11 and other components, the semiconductor protection element 50 of the fifth embodiment can be constructed using a P channel MOS transistor.

Furthermore, the semiconductor protection element 50 of the fifth embodiment is constructed as an element on the P-type semiconductor substrate, however, it can be also constructed as an element on the N-type semiconductor substrate or an SOI.

It is apparent that the present invention is not limited to the above embodiments but may be changed and modified without departing from the scope and spirit of the invention.

What is claimed is:

1. A method for manufacturing a semiconductor protection element comprising:
    a first step of implanting an impurity into a semiconductor substrate to form a first region of a first impurity concentration;
    a second step of forming a pair of second regions having a second impurity concentration being higher than said first impurity concentration on both sides of said first region on a surface of said semiconductor substrate; and
    a third step of forming silicide layers being in contact with a surface of said second region;
    wherein, in said third step, each of said silicide layers is formed in a manner that said first region has a first surface region not covered by said silicide layers and said second region has a second surface region not covered by said silicide layers and that said first surface region is sandwiched by two said second surface regions; and
    wherein each of said silicide layers makes up a low resistance region having a relatively low resistance value, each of said second surface regions makes up an intermediate resistance region having an intermediate resistance value, and said first surface region makes up a high resistance region having a relatively high resistance value.

2. A method for manufacturing a semiconductor protection element comprising:
    a first step of implanting an impurity into a semiconductor substrate to form a first region of a first impurity concentration;
    a second step of forming a pair of second regions having a second impurity concentration being higher than said first impurity concentration on both sides of a first exposed region being exposed in said first region and on a surface of said semiconductor substrate; and
    a step of forming each of said silicide layers being in contact with a surface of said second region so that part of each of said second regions is exposed on said surface of said semiconductor substrate successively so as to be in contact with said first exposed region of said first region;

wherein each of said silicide layers makes up a low resistance region having a relatively low resistance value, each of said second exposed regions in said second region makes up an intermediate resistance region having an intermediate resistance value, and said first exposed region in said first region makes up a high resistance region having a relatively high resistance value.

3. The method for manufacturing a semiconductor protection element according to claim 2, wherein each of said second regions and said first region are overlapped each other on a surface of said semiconductor substrate.

4. The method for manufacturing a semiconductor protection element according to claim 3, wherein, said first impurity concentration of said first region, when it is assumed that a well region is formed on said semiconductor substrate, is higher than that of said well region.

5. The method for manufacturing a semiconductor protection element according to claim 2, wherein said second exposed region has a surface length being equal to or larger than that of said first exposed region.

6. The method for manufacturing a semiconductor protection element according to claim 2, wherein a surface length of said second exposed region is equal to or larger than a depth of said second region.

7. A method for manufacturing a semiconductor protection element comprising:
 a step of implanting an impurity into a semiconductor substrate to form a first region of a first impurity concentration;
 a step of forming a third region having a third impurity concentration being higher than said first impurity concentration in a manner that said third region and said first region are overlapped on a surface of said semiconductor substrate;
 a step of forming a pair of second regions having a second impurity concentration being higher than that of said third region on both sides of a first exposed region being exposed in said third region and on a surface of said semiconductor substrate;
 a step of forming each of said silicide layers being in contact with a surface of said second region so that part of each of said second regions is exposed on a surface of said semiconductor substrate successively so as to be in contact with said first exposed region of said first region;
 wherein each of said silicide layers makes up a low resistance region having a relatively low resistance value, each of said second exposed regions in said second region makes up an intermediate resistance region having an intermediate resistance value, and said first exposed region in said third region makes up a high resistance region having a relatively high resistance value.

8. The method for manufacturing a semiconductor protection element according to claim 7, wherein said second exposed region has a surface length being equal to or larger than that of said first exposed region.

9. The method for manufacturing a semiconductor protection element according to claim 7, wherein a surface length of said second exposed region is equal to or larger than a depth of said second region.

10. A method for manufacturing a semiconductor device comprising:
 a step of implanting an impurity into a semiconductor substrate to form a first region of a first impurity concentration;
 a step of forming first "second region," second "second region" and third "second region" each having an impurity concentration being higher than said first impurity concentration on said semiconductor substrate and of forming said second "second region" and third "second region" on both sides of said first region on a surface of said semiconductor substrate;
 a step of forming silicide layers formed in a manner to be in contact with a surface of each of said first "second region," second "second region" and third "second region" in a manner that said first region has a first surface region not covered with said silicide layers and said second "second region" and third "second region" have second surface regions not covered with said silicide layers and said first surface region is sandwiched by two said second surface regions;
 a step of forming a gate electrode constructed between said silicide layers formed in a manner so as to be in contact with the surfaces of said first "second region" and second "second region;"
 a step of forming one of a source electrode and a drain electrode being formed on the silicide layer formed in a manner so as to be in contact with the surface of said first "second region" and another of said source electrode and said drain electrode being formed on said silicide layer formed in a manner so as to be in contact with the surface of said third "second region;"
 wherein each of said silicide layers makes up a low resistance region having a relatively low resistance value, each of said second surface regions makes up an intermediate resistance region having an intermediate resistance value, and said first surface region makes up a high resistance region having a relatively high resistance value.

11. The method for manufacturing a semiconductor device according to claim 10, further comprising a step of forming a field oxide film formed on said first surface region or said first exposed region.

12. The method for manufacturing a semiconductor device according to claim 10, further comprising a step of forming a gate electrode structure on said first surface region or on said first exposed region.

13. A method for manufacturing a semiconductor device comprising:
 a step of implanting an impurity into a semiconductor substrate to form a first region of a first impurity concentration;
 a step of forming first "second region," second "second region" and third "second region" each having an impurity concentration being higher than said first impurity concentration on said semiconductor substrate and said second "second region" and third "second region" are formed on a surface of said semiconductor substrate on both sides of said first exposed region so that said first region has a first exposed region being exposed on a surface of said semiconductor substrate;
 a step of forming each of said silicide layers being in contact with a surface of each of said first "second region," second "second region" and third "second region" so that said second "second region" and third "second region" so as to have a second exposed region being successively in contact with said first exposed region of said first region;

a step of forming a gate electrode constructed between said silicide layers formed in a manner so as to be in contact with surfaces of said first "second region" and second "second region;"

a step of forming one of a source electrode and a drain electrode being formed on the silicide layer formed in a manner so as to be in contact with a surface of said first "second region" and another of said source electrode and said drain electrode being formed on said silicide layer formed in a manner so as to be in contact with the surface of said third "second region;"

wherein each of said silicide layers makes up a low resistance region having a relatively low resistance value, each of said second exposed regions in said second region makes up an intermediate resistance region having an intermediate resistance value, and said first exposed region in said first region makes up a high resistance region having a relatively high resistance value.

14. The method for manufacturing a semiconductor device according to claim 13, wherein said second region are formed on a surface of said semiconductor substrate in a manner that said second region and said first region are overlapped.

15. The method for manufacturing a semiconductor device according to claim 14, wherein, said first impurity concentration of said first region, when it is assumed that a well region is formed on said semiconductor substrate, is higher than that of said well region.

16. The method for manufacturing a semiconductor device according to claim 13, wherein a surface length of said second exposed region is equal to or larger than a depth of said second region.

17. The method for manufacturing a semiconductor device according to claim 13, wherein a surface length of said second exposed region is equal to or larger than a depth of said second region.

18. The method for manufacturing a semiconductor device according to claim 13, further comprising a step of forming a field oxide film formed on said first surface region or said first exposed region.

19. The method for manufacturing a semiconductor device according to claim 13, further comprising a step of forming a gate electrode structure on said first surface region or on said first exposed region.

20. A method for manufacturing a semiconductor device comprising:

a step of implanting an impurity into a semiconductor substrate to form a first region of a first impurity concentration;

a step of forming a third region having a third impurity concentration being higher than said first impurity concentration in a manner that said third region and said first region are overlapped on a surface of said semiconductor substrate;

a step of forming first "second region," second "second region" and third "second region" each having a second impurity concentration being higher than said third impurity concentration in said third region on said semiconductor substrate and said second "second region" and third "second region" are formed on a surface of said semiconductor substrate on both sides of said first exposed region so that said third region has a first exposed region being exposed on a surface of said semiconductor substrate;

a step of forming each of said silicide layers being in contact with a surface of each of said first "second region," second "second region" and third "second region" so that said second "second region" and third "second region" are exposed successively so as to be in contact with said first exposed region of said first region;

a step of forming a gate electrode constructed between said silicide layers formed in a manner so as to be in contact with the surfaces of said first "second region" and second "second region;"

a step of forming one of a source electrode and a drain electrode being formed on one of the silicide layers formed in a manner so as to be in contact with the surface of said first "second region" and another of said source electrode and said drain electrode being formed on another out of said silicide layers formed in a manner so as to be in contact with the surface of said third "second region;"

wherein each of said silicide layers makes up a low resistance region having a relatively low resistance value, each of said second exposed regions in said second region makes up an intermediate resistance region having an intermediate resistance value, and said first exposed region in said third region makes up a high resistance region having a relatively high resistance value.

21. The method for manufacturing a semiconductor device according to claim 20, wherein a surface length of said second exposed region is equal to or larger than a depth of said second region.

22. The method for manufacturing a semiconductor device according to claim 20, wherein a surface length of said second exposed region is equal to or larger than a depth of said second region.

23. The method for manufacturing a semiconductor device according to claim 20, further comprising a step of forming a field oxide film formed on said first surface region or said first exposed region.

24. The method for manufacturing a semiconductor device according to claim 20, further comprising a step of forming a gate electrode structure on said first surface region or on said first exposed region.

* * * * *